US010840365B2

(12) United States Patent
Omura et al.

(10) Patent No.: US 10,840,365 B2
(45) Date of Patent: Nov. 17, 2020

(54) INSULATED GATE BIPOLAR TRANSISTOR DEVICE, MANUFACTURING METHOD FOR SEMICONDUCTOR DEVICE, AND MANUFACTURING METHOD FOR INSULATED GATE BIPOLAR TRANSISTOR DEVICE

(71) Applicants: Kyushu Institute of Technology, Fukuoka (JP); Mitsubishi Electric Corporation, Tokyo (JP); Kabushiki Kaisha Toshiba, Tokyo (JP)

(72) Inventors: Ichiro Omura, Fukuoka (JP); Katsumi Satoh, Tokyo (JP); Tomoko Matsudai, Tokyo (JP)

(73) Assignees: Kyushu Institute of Technology, Fukuoka (JP); Mitsubishi Electric Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 16/467,406

(22) PCT Filed: Dec. 9, 2017

(86) PCT No.: PCT/JP2017/044260
§ 371 (c)(1),
(2) Date: Jun. 6, 2019

(87) PCT Pub. No.: WO2018/105749
PCT Pub. Date: Jun. 14, 2018

(65) Prior Publication Data
US 2020/0098902 A1 Mar. 26, 2020

(30) Foreign Application Priority Data
Dec. 9, 2016 (JP) .................................. 2016-239927

(51) Int. Cl.
*H01L 29/66* (2006.01)
*H01L 29/739* (2006.01)
(Continued)

(52) U.S. Cl.
CPC ........ *H01L 29/7397* (2013.01); *H01L 21/765* (2013.01); *H01L 29/0696* (2013.01);
(Continued)

(58) Field of Classification Search
CPC ........... H01L 29/0696; H01L 29/17397; H01L 29/1095; H01L 29/41708; H01L 29/66348; H01L 21/765
See application file for complete search history.

(56) References Cited

U.S. PATENT DOCUMENTS

2005/0280086 A1* 12/2005 Saito .................... H01L 29/0634
257/341
2008/0164517 A1* 7/2008 Ohta .................... H01L 29/7813
257/330
(Continued)

FOREIGN PATENT DOCUMENTS

JP    H09-331063 A    12/1997
JP    2011-165971 A    8/2011
(Continued)

OTHER PUBLICATIONS

International Search Report (ISR) dated Feb. 13, 2018 filed in PCT/JP2017/044260.
(Continued)

*Primary Examiner* — Phuc T Dang
(74) *Attorney, Agent, or Firm* — Rankin, Hill & Clark LLP

(57) ABSTRACT

It is a purpose of the present invention to provide an insulated gate bipolar transistor device or the like that exhibits high performance and that is suitable for mass production.
The insulated bipolar transistor device includes multiple trench structures including at least a trench gate, a first dummy trench, and a second dummy trench. The first
(Continued)

dummy trench and the second dummy trench are configured as adjacent trenches. The trench gate is connected to a gate electrode layer. The first dummy trench and the second dummy trench are connected to an emitter electrode layer, and are not connected to the gate electrode layer. A first conductive source layer is also formed between the first dummy trench and the second dummy trench.

29 Claims, 10 Drawing Sheets

(51) Int. Cl.
*H01L 21/765* (2006.01)
*H01L 29/06* (2006.01)
*H01L 29/10* (2006.01)
*H01L 29/40* (2006.01)
*H01L 29/417* (2006.01)

(52) U.S. Cl.
CPC ........ *H01L 29/1095* (2013.01); *H01L 29/404* (2013.01); *H01L 29/407* (2013.01); *H01L 29/41708* (2013.01); *H01L 29/66348* (2013.01)

(56) References Cited

U.S. PATENT DOCUMENTS

2015/0311253 A1* 10/2015 Choi ................ H01L 43/12 257/252
2016/0372585 A1 12/2016 Furukawa et al.
2017/0069625 A1* 3/2017 Hirabayashi ...... H01L 21/26513

FOREIGN PATENT DOCUMENTS

JP 2014-157883 A 8/2014
WO 2015/162811 A1 10/2015

OTHER PUBLICATIONS

M. Shiraishi et al., "Side Gate HiGT with Low dv/dt Noise and Low Loss", Proc. of ISPSD 2016, pp. 199-202.; Cited in Specification Hao Feng et al., "A 1200 V-class Fin P-body IGBT with Ultra-narrow-mesas for Low Conduction Loss", Proc. of ISPSD 2016, pp. 203-206.; Cited in Specification.

M. Tanaka et al., "Structure oriented compact model for advanced trench IGBTs without fitting parameters for extreme condition: Part I", Microelectronics Reliability 51, 2011. pp. 1933-1937.; Cited in Specification.

Masahiro Tanaka et al., "IGBT scaling principle toward CMOS compatible wafer processes", Solid-State Electronics vol. 80, 2013, pp. 118-123.; Cited in Specification.

Kota Seto et al., "Universal Trench Edge Termination Design", Proc. of ISPSD 2012, pp. 161-164.; Cited in Specification.

J. Takaishi et al., "Structure oriented compact model for advanced tranch IGBTs without fitting parameters for extreme condition: Part II", Microelectronics Reliability 54, 2014, pp. 1891-1896.; Cited in Specification.

* cited by examiner

Fig. 1
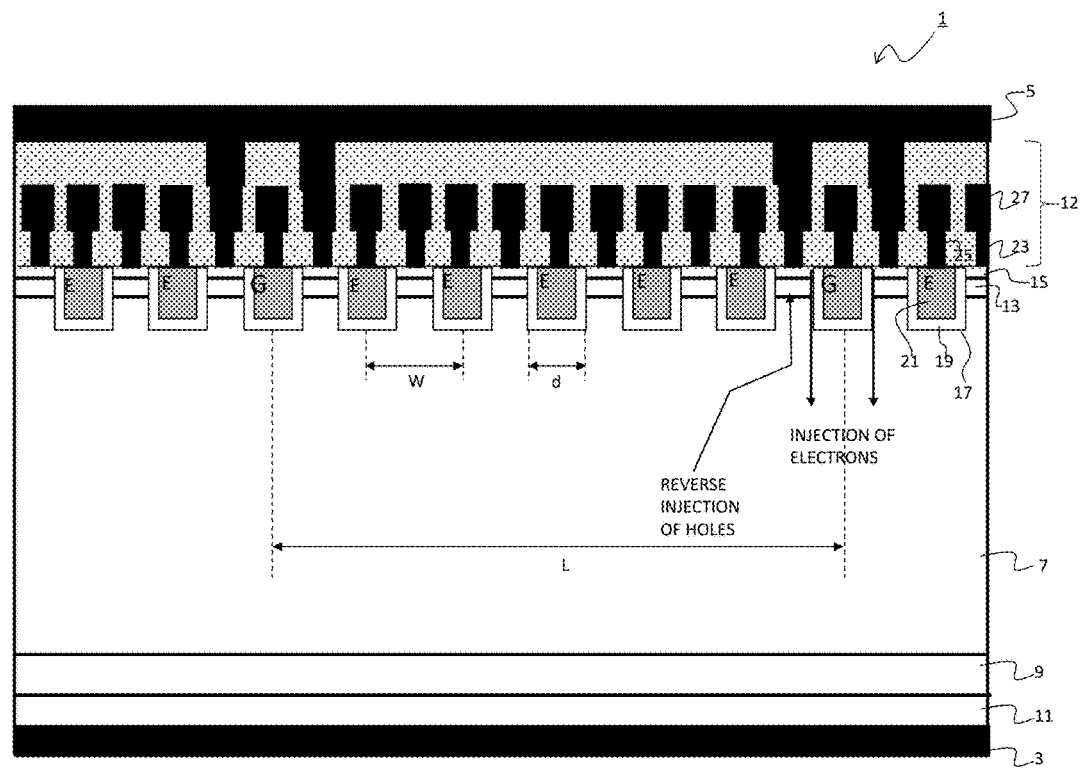
(a)
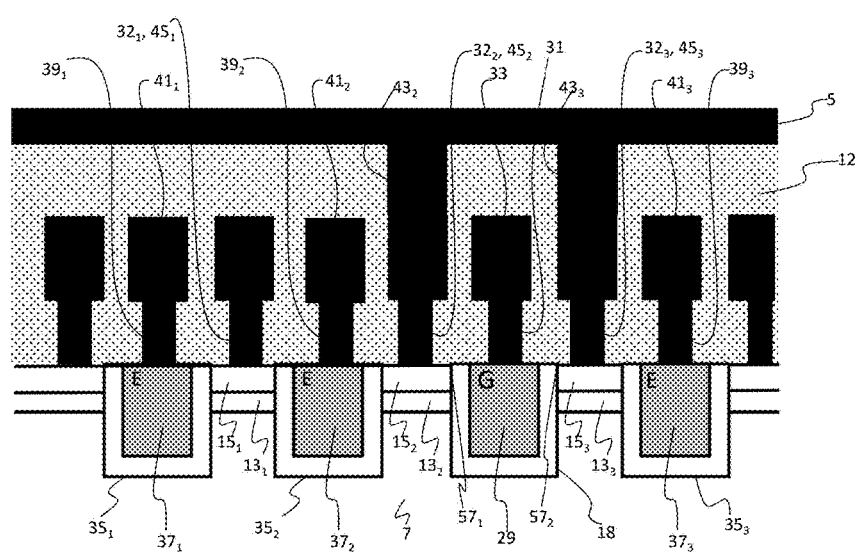
(b)

Fig. 3
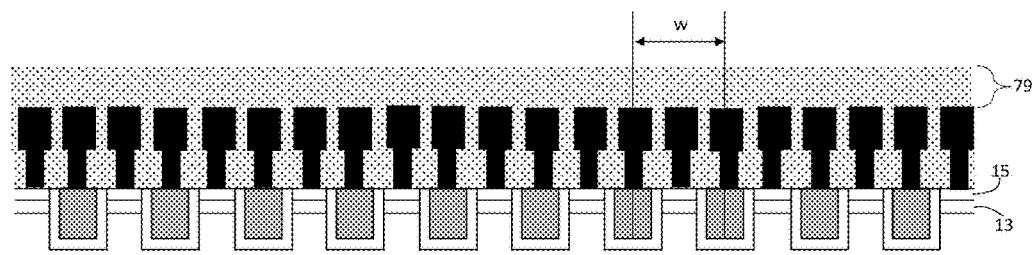
(a)
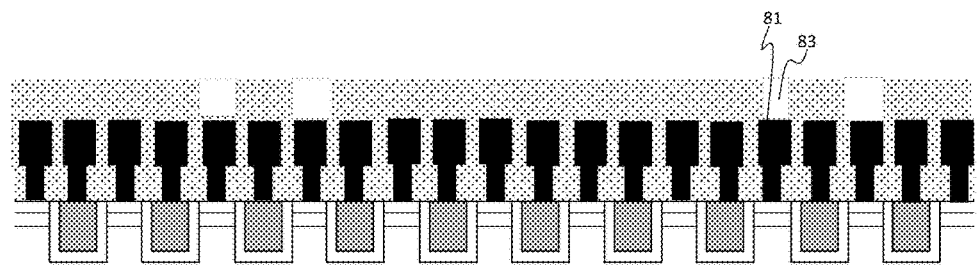
(b)
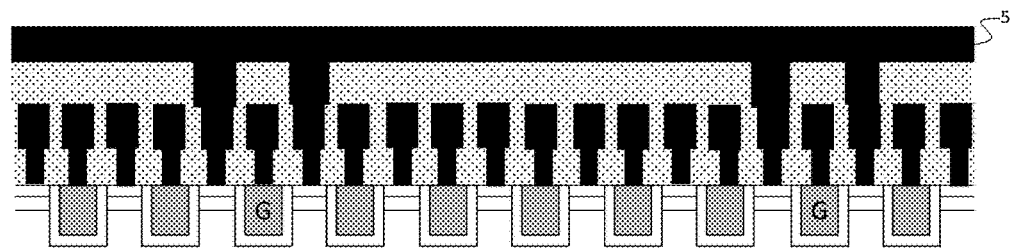
(c)

Fig. 5
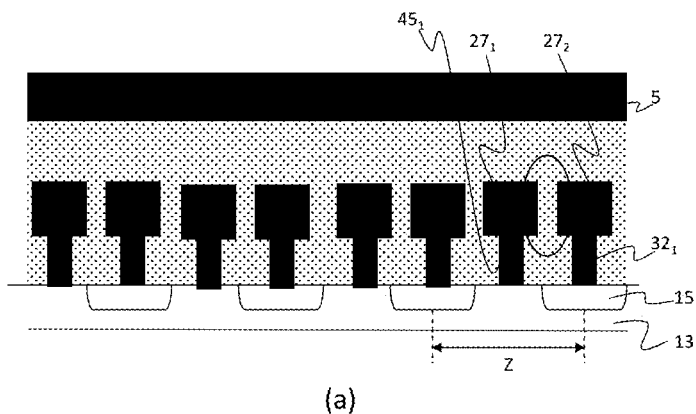
(a)
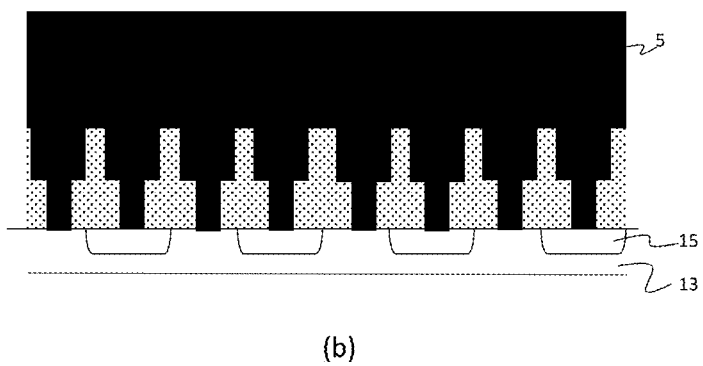
(b)

INSULATED GATE BIPOLAR TRANSISTOR DEVICE, MANUFACTURING METHOD FOR SEMICONDUCTOR DEVICE, AND MANUFACTURING METHOD FOR INSULATED GATE BIPOLAR TRANSISTOR DEVICE

TECHNICAL FIELD

The present invention relates to a power semiconductor device widely employed in household air conditioners, HEVs (Hybrid Electric Vehicles), EVs (Hybrid Vehicles), DC power transmission systems, etc., and particularly to insulated gate bipolar transistor devices, etc.

BACKGROUND ART

Commercialized power semiconductor IGBTs (Insulated Gate Bipolar Transistors) have been known for 30 years. However, improved IGBTs are still being developed. Also, the market size thereof rises by 10% or more per year. IGBTs are capable of controlling high voltage and large current although they have a MOS gate configuration. Accordingly, IGBTs are widely employed in various kinds of fields (Non-patent documents 1 through 6).

The performance of IGBTs can be tuned by adjusting the cell pitch, which is the distance between adjacent cells. Here, a cell is defined as a region from a contact of an emitter electrode formed in an emitter region including a gate electrode up to another contact of the adjacent emitter electrode. In a case in which a higher priority level is placed on the high-speed switching operation, the cell pitch is designed to be small. In a case in which a higher priority level is placed on the low power loss performance, the cell pitch is designed to be widened to a certain extent. For example, as a tuning method, in a case in which the IGBT is designed to be employed in a switching power supply, the cell itch is designed to be narrowed to a certain extent. In contrast, in a case in which the IGBT is designed to be employed in a motor driver, the cell pitch is designed to be widened. Also, in a case in which the IGBT is designed as a high-breakdown element, the cell pitch is designed to be widened. In contrast, in a case in which the IGBT requires only low-breakdown performance, the cell pitch is designed to be narrowed.

As conventional insulated gate bipolar transistor devices, an arrangement has been known in which emitter trenches are sequentially arranged, each of which includes an emitter electrode embedded in the internal portion of a trench having the same structure as a trench gate including a gate electrode embedded in the internal portion of a trench (Patent document 1).

CITATION LIST

Patent Literature

[Patent Document 1]
Japanese Patent Application Laid-Open No. H09-331063

Non-Patent Literature

[Non-Patent Document 1]
Masaki Shiraishi et al., Proc. of ISPSD 2016, p 119. 2016.
[Non-Patent Document 2]
Hao Feng, et al. Proc. of ISPSD 2016, p 203, 2016.
[Non-Patent Document 3]
M. Tanaka, and I. Omura, Microelectronics Reliability 51, pp. 1933-1937.
[Non-Patent Document 4]
Masahiro Tanaka and Ichiro Omura, Solid-State Electronics vol. 80, pp. 118-123.
[Non-Patent Document 5]
Kota Seto, at al., Proc. of ISPSD2012, pp. 161-164.
[Non-Patent Document 6]
J. Takaishi, et al., Microelectronics Reliability 54, pp. 1891-1896.

SUMMARY OF INVENTION

Technical Problem

However, such an arrangement requires a process such as lithography steps for forming a P-base layer and an N-base layer or the like, which are to be performed in an initial stage of a wafer process, to be designed according to the difference in the cell pitch. This requires a long time to ship such IGBTs even if manufacturing of the IGBTs is started immediately after a manufacturer receives a request from a customer, which is a problem. Furthermore, the change in cell pitch requires the process conditions such as lithography conditions, etching conditions, etc., to be changed. Accordingly, such an arrangement requires a tuning operation according to the difference in the cell pitch from the process integration viewpoint, leading to a problem of increased development costs.

It cannot be said that such conventional insulated gate bipolar transistor devices including the device described in Patent document 1 have a configuration that sufficiently meets the above-described request.

Accordingly, it is a purpose of the present invention to provide an insulated gate bipolar transistor device or the like that exhibits high performance and that is suitable for mass production.

Solution of Problem

A first aspect of the present invention relates to an insulated gate bipolar transistor device comprising a first main electrode layer, a second main electrode, and a control electrode. The insulated gate bipolar device comprises: a first conductive first semiconductor layer; a first conductive second semiconductor layer formed in a first main electrode layer side of the first conductive first semiconductor layer; a second conductive first semiconductor layer formed between the first conductive second semiconductor layer and the first main electrode layer; a second conductive second semiconductor layer formed in a second main electrode side of the first conductive first semiconductor layer; a first conductive third semiconductor layer selectively formed in a second main electrode side of the second conductive second semiconductor layer; and multiple groove structures each protruding from a surface on a second main electrode side of the second conductive second semiconductor layer or otherwise the first conductive third semiconductor layer up to the first conductive first semiconductor layer. Each of the groove structures comprises: a conductive material region configured of a semiconductor material; and an insulating film formed on a surface of the conductive material region except for a surface on a second main electrode side. The multiple groove structures comprise at least: a main control groove structure; a first pseudo groove structure; and a second pseudo groove structure. There is any one from among other groove structures between the first pseudo groove structure and the second pseudo groove structure. A main control conductive material region configured as the conductive material region included in the main control groove structure is connected to the control electrode. A first electrode formed on a surface of the first conductive third semiconductor layer adjacent to the main control groove structure and a second electrode formed on a surface of the second conductive second semiconductor layer adjacent to the main control groove structure are connected to the second main electrode. A first pseudo conductive material region configured as the conductive material region included in the first pseudo groove structure is connected to the second main electrode without being connected to the control electrode. A second pseudo conductive material region configured as the conductive material region included in the second pseudo groove structure is connected to the second main electrode without being connected to the control electrode. The first conductive third semiconductor layer is also formed between the first pseudo groove structure and the second pseudo groove structure.

A second aspect of the present invention relates to an insulated gate bipolar transistor device comprising a collector electrode layer, an emitter electrode layer, and a gate electrode layer. The insulated to bipolar device comprises: a first conductive high-resistance layer; a first conductive buffer layer formed in a collector electrode layer side of the first conductive high-resistance layer; a second conductive emitter layer formed between the first conductive buffer layer and the collector electrode layer; a second conductive base layer formed in an emitter electrode layer side of the first conductive high-resistance layer; a first conductive source layer selectively formed in an emitter electrode layer side of the second conductive base layer; and multiple trench structures each protruding from a surface on an emitter electrode layer side of the second conductive base layer or otherwise the first conductive source layer up to the first conductive high-resistance layer. Each of the trench structures comprises: a trench portion configured of a semiconductor material; and an insulating film formed on a surface of the trench portion except for a surface on a side of the emitter electrode layer. The multiple trench structures comprise at least: a trench gate; a first dummy gate; and a second dummy gate. There is any one from among other trench structures between the first dummy trench and the second dummy trench. A gate trench portion configured as the trench portion included in the trench gate is connected to the gate electrode layer. A plug electrode formed on a surface of the first conductive source layer adjacent to the trench gate and a second plug electrode formed on a surface of the second conductive base layer adjacent to the trench gate are connected to the emitter electrode layer. A first dummy trench portion configured as the trench portion included in the first dummy trench is connected to the emitter electrode layer without being connected to the gate electrode layer. A second dummy trench portion configured as the trench portion included in the second dummy trench is connected to the emitter electrode layer without being connected to the gate electrode layer. The first conductive source layer is also formed between the first dummy trench and the second dummy trench.

A third aspect of the present invention relates to the insulated gate bipolar transistor device according to the second aspect. The first conductive source layer and the second conductive base layer are structured on a surface on an emitter electrode layer side such that they are alternately arranged along a longitudinal direction of the trench gate. The first conductive source layer and the second conductive base layer are also structured on a surface interposed between the first dummy trench and the second dummy trench on an emitter electrode layer side such that they are alternately arranged along a longitudinal direction of the first dummy trench and the second dummy trench.

A fourth aspect of the present invention relates to the insulated gate bipolar transistor device according to the second or third aspect. A third plug electrode that differs from the first plug electrode and the second plug electrode is formed between the first dummy trench and the second dummy trench such that it is in contact with at least one from among the first conductive source layer and the second conductive base layer.

A fifth aspect of the present invention relates to the insulated gate bipolar transistor device according to the fourth aspect. The third plug electrode is arranged such that it is in contact with the first conductive source layer formed between the first dummy trench and the second dummy trench. The third plug electrode and the emitter electrode layer are electrically insulated from each other.

A sixth aspect of the present invention relates to the fourth or fifth aspect of the present invention. A fourth plug electrode that differs from the first plug electrode and the second plug electrode is arranged such that it is in contact with the second conductive base layer formed between the first dummy trench and the second dummy trench. The fourth plug electrode and the emitter electrode layer are electrically insulated from each other.

A seventh aspect of the present invention relates to the insulated gate bipolar transistor device according to any one of the fourth through sixth aspects. The third plug electrode is arranged such that it is in contact with the first conductive source layer formed between the first dummy trench and the second dummy trench. A fourth plug electrode that differs from the first plug electrode, the second plug electrode, and the third plug electrode is arranged such that it is in contact with the second conductive base layer formed between the first dummy trench and the second dummy trench. The third plug electrode and the fourth plug electrode are electrically insulated from each other.

An eighth aspect of the present invention relates to the insulated gate bipolar transistor device according to any one of the second through seventh aspects of the present invention. The insulated gate bipolar transistor device comprises at least two layers between the first conductive source layer and the emitter electrode layer. The at least two layers comprise: a plug electrode layer arranged such that it is in contact with the first conductive source layer and comprising the first plug electrode and the second plug electrode; and an insulating layer configured to selectively insulate an electrical connection to the emitter electrode layer. The trench gate and the first dummy trench are configured as adjacent trench structures. The plug electrode layer that corresponds to a portion interposed between the trench gate and the first dummy trench has the same structure as that of the plug electrode layer that corresponds to a portion interposed between the first dummy trench and the second dummy trench.

A ninth aspect of a ninth aspect of the present invention relates to the insulated gate bipolar transistor device according to the eighth aspect. A trench width defined as a width of the trench structure configured on a surface on an emitter electrode layer side is larger than half of a center-to-center distance between the adjacent trench structures.

A tenth aspect of the present invention relates to the insulated gate bipolar transistor device according to any one of the second through ninth aspects. Wiring connected to the first plug electrode, the second plug electrode, as well as or otherwise the emitter electrode layer is configured of a copper material.

An eleventh aspect of the present invention relates to the insulated gate bipolar transistor device according to the tenth aspect. The emitter electrode layer is connected to the first dummy trench portion as well as or otherwise the second dummy trench portion via copper wiring. A wiring structure is formed such that it extends in a direction that is orthogonal to a surface of the first conductive source layer on the emitter electrode layer side.

A twelfth aspect of the present invention relates to an insulated gate bipolar transistor device comprising a first main electrode, a second main electrode, and a control electrode. The first conductive first semiconductor layer is arranged between the first main electrode and the second main electrode. The first conductive first semiconductor layer comprises a first groove structure, a second groove structure, and a third groove structure, each of which is configured as a groove structure that protrudes from a surface on the second main electrode side toward the first main electrode side. There is no groove structure between the first groove structure and the second groove structure. The first groove structure and the second groove structure are each electrically connected to the second main electrode. The third groove structure is electrically connected to the control electrode. A region of the first conductive first semiconductor layer interposed between the first groove structure and the second groove structure further comprises: a second conductive first semiconductor layer in which an inversion layer is to be formed by means of the control electrode; and a first conductive second semiconductor layer configured to inject carriers into the inversion layer formed in the second conductive first semiconductor layer.

A thirteenth aspect of the present invention relates to a manufacturing method for a semiconductor device. The manufacturing method comprises: a second conductive base layer formation in which a second conductive base layer is formed in a first conductive high-resistance layer; a first conductive source layer formation in which a first conductive source layer is formed as an internal portion of the second conductive base layer; a trench formation in which multiple trench structures are formed such that they pass through the second conductive base layer and reach the first conductive high-resistance layer; and a plug electrode layer formation in which a plug electrode layer comprising multiple plug electrodes is formed such that the plug electrodes are individually in contact with the multiple trench structures, the multiple first conductive source layer portions, and the multiple second conductive base layer portions.

A fourteenth aspect of the present invention relates to the manufacturing method for the semiconductor device according to the thirteenth aspect of the present invention. In the first conductive source layer formation, the first conductive source layer is formed for all the multiple second conductive base layer portions.

A fifteenth aspect of the present invention relates to the manufacturing method for the semiconductor device according to the thirteenth or fourteenth aspect of the present invention. The manufacturing method further comprises polishing in which the plug electrode layer is polished.

A sixteenth aspect of the present invention relates to a manufacturing method for an insulated gate bipolar transistor device comprising an emitter wiring structure formation in which a wiring structure is formed for the semiconductor device manufactured using the manufacturing method according to any one of the thirteenth through fifteenth such that a part of the multiple plug electrodes are connected to the emitter electrode layer.

A seventeenth aspect of the present invention relates to the insulated gate bipolar transistor device according to the first aspect, comprising multiple pseudo groove structure pairs of the first pseudo groove structure and the second pseudo groove structure according to the first aspect, with the second conductive second semiconductor layer according to the first aspect formed between the first pseudo groove structure and the second pseudo groove structure, and with the first conductive third semiconductor layer according to the first aspect not formed between the first pseudo groove structure and the second pseudo groove structure. Otherwise, the seventeenth aspect of the present invention relates to the insulated gate bipolar transistor device according to the twelfth aspect, comprising multiple groove structure pairs of the first groove structure and the second groove structure according to the twelfth aspect, with the second conductive first semiconductor layer according to according to the twelfth aspect formed between the first groove structure and the second groove structure, and with the first conductive second semiconductor layer according to the twelfth aspect not formed between the first groove structure and the second groove structure.

An eighteenth aspect of the present invention relates to the insulated gate bipolar transistor device according to the seventeenth aspect. The insulated gate bipolar transistor device further comprises multiple first pseudo groove structures and multiple second pseudo groove structures. At least a part of the second conductive second semiconductor layer portions each formed between the first pseudo groove structure and the second pseudo groove structure is not directly connected to the second main electrode.

A nineteenth aspect of the present invention relates to the insulated gate bipolar transistor device according to the seventeenth or eighteenth aspect. The insulated gate bipolar transistor device further comprises multiple first pseudo groove structures and multiple second pseudo groove structures. A part of the second conductive second semiconductor layer portions each formed between the first pseudo groove structure and the second pseudo groove structure is directly connected to the second main electrode.

A twentieth aspect of the present invention relates to the insulated gate bipolar transistor device according to the nineteenth aspect. The insulated gate bipolar transistor device comprises the first pseudo groove structure or otherwise the second pseudo groove structure interposed between the second conductive second semiconductor layer portions each directly connected to the second main electrode. The second pseudo groove structure is directly connected to the control electrode.

A twenty-first aspect of the present invention relates to the insulated gate bipolar transistor device according to the twentieth aspect. At least one from among the second conductive second semiconductor layer portions arranged on both sides of the first pseudo groove structures or otherwise the second pseudo groove structures has a region that is in contact with the first pseudo groove structure or otherwise the second pseudo groove structure with a depth that is 90% or more of a depth of the first pseudo groove structure or otherwise the second pseudo groove structure.

A twenty-second aspect of the present invention relates to the insulated gate bipolar transistor device according to any one of the seventeenth through twenty-first aspects. The insulated gate bipolar transistor device further comprises two or more layers between the first conductive third semiconductor layer and the second main electrode. The two or more layers comprise: a plug electrode layer configured such that it is in contact with the first conductive third semiconductor layer and to have the first electrode and the second electrode; and an insulating layer configured to selectively insulate electrical connection to the second main electrode. The trench gate and the first dummy trench are configured as adjacent trench structures. The plug electrode layer that corresponds to a portion interposed between the trench gate and the first dummy trench has the same structure as that of the plug electrode layer that corresponds to a portion interposed between the first dummy trench and the second dummy trench.

A twenty-third aspect of the present invention relates to the insulated gate bipolar transistor device according to the first aspect. The insulated gate bipolar transistor device further comprises a third electrode and a fourth electrode connected to the second main electrode. The third electrode and the fourth electrode are each configured such that they pass through a first conductive third semiconductor layer adjacent to the main control groove structure, such that they reach an interior of a second conductive second semiconductor layer, and such that they are not in contact with the first conductive high resistance layer.

A twenty-fourth aspect of the present invention relates to the insulated gate bipolar transistor device according to the twenty-third aspect. The first conductive third semiconductor layer and the second conductive second semiconductor layer are configured on a surface on a second main electrode side interposed between the multiple groove structures such that they are alternately exposed in a longitudinal direction of the groove structures.

A twenty-fifth aspect of the present invention relates to the insulated gate bipolar transistor device according to any one of the first through twelfth aspects and the seventeenth through twenty-fourth aspects. An area of a portion thereof on which the groove structures are not formed is smaller than 30% or less of an effective element area. The groove structure is configured with a groove depth that is three times or more a groove width thereof.

A twenty-sixth aspect of the present invention relates to the insulated gate bipolar transistor device according to any one of the first through twelfth aspects and the seventeenth through twenty-fifth aspects. A portion interposed between the two adjacent groove structures is configured with a size of 0.5 µm or less.

Advantageous Effects of Invention

According to each aspect of the present invention, the trench gate configured to function as a gate electrode and the dummy trench configured to have no function as such a gate electrode both designed as a common trench structure. After the trench structures have been formed for an insulated gate bipolar transistor device (IGBT), this allows the trench gates to be determined from among the trench structures thus formed. This arrangement allows a stock of intermediate-product IGBTs to be prepared and to be kept, thereby dramatically reducing the time from manufacturing until shipping. Accordingly, this arrangement provides improved mass production.

The first conductive layer interposed between the dummy trenches does not contribute to a function as an IGBT. It can be said that, with conventional techniques, such a first conductive layer is not formed in a portion interposed between the dummy trenches because there is a disadvantage in forming such a useless structure.

However, with the present invention, emphasis is placed on the advantage of preparing and keeping a stock of intermediate products, and on the design flexibility which allows the trench gates to be determined from among the trench structures after the trench gate formation step ends, which is an advantage of such an arrangement according to a novel technique and is the technical feature of the present invention.

According to the fourth aspect of the present invention, the plug electrode is also formed at a position interposed between the dummy trenches in addition to a position adjacent to the trench gate. This further improves the IGBT mass production.

An arrangement in which the plug electrodes are arranged such that they are in contact with the first conductive layer or the second conductive base layer contributes to no electrical operation. Accordingly, from the viewpoint of conventional design thinking, it can be said that such an arrangement involves formation of a useless structure, which is undesirable.

However, according to the fourth aspect of the present, invention, such an arrangement allows the plug electrodes to be formed regardless of the kind of the trench structure. This allows a stock of intermediate products on which the common structure layers including the plug electrode layer have been formed to be prepared and to be kept even before determining the trench gates from among the trenches. Accordingly, from the viewpoint of the present invention, such an arrangement is further advantageous Furthermore, with the fourth aspect of the present invention, this arrangement provides improved heat radiation performance on the emitter region side of the insulated gate bipolar transistor device. With typical IGBT chips, heat generation is large at silicon portions in the emitter region formed on the upper face. However, typically, heat radiated from the collector region side, i.e., from the bottom face side of the IGBT chip. That is to say, there has been no idea to use the wiring including the emitter electrode layer formed on the upper face of the chip for heat radiation. However, by increasing the number of the plug electrodes connected such that they are directly in contact with the silicon surface, this arrangement allows the heat that occurs on the silicon surface to propagate to the emitter electrode layer with high efficiency, thereby providing improved heat radiation performance.

With the fifth aspect of the present invention, this arrangement is capable of suppressing a malfunction due to latch-up that occurs due to parasitic thyristors that occur in the emitter region. In case in which the first conductive layer interposed between the dummy trenches is connected to the emitter electrode layer, such an arrangement involves a parasitic thyristor in the device structure. In some cases, this causes a malfunction due to latch-up. In particular, with such an arrangement, the electric potentials of adjacent second conductive base layer surfaces are not fixed. Accordingly, the electric potential of the second conductive base layer interposed between the dummy trenches is not fixed, i.e., is in a floating state. This raises the potential to cause a malfunction due to latch-up. Accordingly, it can be said that the fifth aspect of the present invention is highly advantageous.

With the sixth or seventh aspect of the present invention, such an arrangement is capable of suppressing a reduction of the carriers stored in the first conductive high-resistance layer in the IGBT conduction state. For example, in a case in which the first conductive source layer interposed between the dummy gates is electrically connected to the adjacent second conductive base layer via the plug electrode and its upper wiring layer, when the IGBT is turned on, the electrons accumulated in the first conductive high-resistance layer flow into the first conductive source layer, and the holes accumulated in the first conductive high-resistance layer flow into the second conductive base layer. This leads to reduction of the accumulation of the electrons and holes that are carriers accumulated in the first conductive high-resistance layer with the sixth or seventh aspect of the present invention, this arrangement is capable of suppressing this problem.

With the seventh aspect of the present invention, such an arrangement is capable of more easily suppressing malfunction due to the occurrence of latch-up in parasitic thyristors. In some cases, the second conductive base layer interposed between the dummy trenches is connected to the emitter electrode layer at its end portion in the longitudinal direction of the trenches. In this case, in a case in which the first conductive layer and the second conductive base layer are electrically connected, such an arrangement has the potential to cause a malfunction due to the occurrence of latch-up as described above. Accordingly, with the seventh aspect of the present invention, this arrangement is capable of suppressing this problem.

With the eighth aspect of the present invention, this arrangement allows a cyclic structure to be formed up to the plug electrode layer formation step. This allows a common fine-structure formation process to be designed up to the plug electrode layer formation step. Such an arrangement does not require a different process design and process tuning for each device. This allows a stock of intermediate-product insulated bipolar transistor devices to be more easily prepared and to be kept.

With the insulated gate bipolar transistor device according to the ninth aspect of the present invention, in a case of manufacturing a fine structure in which the distance between the adjacent trench structures is very small, this arrangement requires only the emitter electrode layer wiring structure that is in contact with the plug electrodes to be designed to select the trench gates. This provides improved yield in the manufacturing of the insulated gate bipolar transistor devices in a simple manner.

With the tenth aspect of the present invention, in a case in which the plug electrodes and/or the emitter electrode layer is formed of a copper material, this arrangement is capable of suppressing degradation of the reliability of the insulated gate bipolar transistor device due to electromigration as compared with an arrangement in which they are formed of other metal materials such as an aluminum material or the like.

With the eleventh aspect of the present invention, this arrangement requires only short wiring as compared with an arrangement in which the first conductive source layer is connected to the emitter electrode layer via wiring extending in a direction that is in parallel with the plane direction. Accordingly, such an arrangement is capable of further suppressing degradation of the reliability of the insulated gate bipolar transistor device due to electromigration.

Furthermore, with the fifteenth aspect of the present invention, such an arrangement is capable of suppressing poor connection between the plug electrode layer and the emitter electrode layer of the semiconductor device prepared and kept as a stock of intermediate-product semiconductor devices.

At present, in many cases, insulated gate bipolar transistor devices are manufactured on a line with a wafer diameter of 200 mm. This leads to a difficulty in supporting the increasing market demand. Furthermore, with the standard clean room specification, 300-mm mass production lines and 300-mm manufacturing apparatuses have become mainstream. Accordingly, it is predicted that it will be difficult to support 200-mm lines in the future.

In 300-mm lines, fine-structure manufacturing processes have become mainstream with a minimum manufacturing size on the order of 100 nm or less. Accordingly, in a case of forming trench structures with a depth of 1 μm or more or diffused layer portions with a diffusion depth of 1 μm, i.e., with a dimension one order larger than that employed in 300-mm lines, this requires additional process development and additional apparatus installation, leading to increased costs. Furthermore, in a case of designing a device having trench structures and diffused layer portions with a large depth, the manufacturing line and the manufacturing apparatuses cannot be shared with other device products. This requires dedicated lines and dedicated manufacturing apparatuses for power semiconductor devices such as IGBTs, leading to a problem of increased manufacturing costs.

In order to solve this problem, recently, a basic idea has been proposed in which an emitter region having a fine structure provides improved electrical characteristics of IGBTs (Non-patent documents 3 and 4). However, there is no proposed structure suitable for such a fine process. Accordingly, such an IGBT is not necessarily configured with high manufacturing efficiency.

Accordingly, with the device structure and the manufacturing method employed in the insulated gate bipolar transistor device according to each aspect of the present invention, this arrangement allows a stock of intermediate-product devices to be prepared and kept in a simple manner, and further improves the mass production, which is advantageous.

Furthermore, for conventional insulated gate bipolar transistor devices, there is a demand for further improvement in characteristics such as improved latching tolerance, reduction of on-voltage, etc.

In particular, from the viewpoint of the device structure, there are expectations for improvement in the characteristics of insulated gate bipolar transistor devices.

With the seventeenth aspect of the present invention, there are portions (mesa portions) that involve no parasitic thyristor (pnpn four layer structure) between the first pseudo groove structure and the second pseudo groove structure. Accordingly, such portions involve no latch-up operation. This provides the insulated gate bipolar transistor device with improved latch-up tolerance, thereby providing stable operation.

With the eighteenth aspect of the present invention, the second conductive second semiconductor layer (e.g., P-base layer) formed in a portion (mesa) interposed between the first pseudo groove structure and the second pseudo groove structure is not directly connected to the second main electrode (e.g., emitter electrode layer). Accordingly, a large voltage difference occurs between the emitter electrode layer and the second conductive base layer. Accordingly, when the device is turned on, electrons are injected with high efficiency into the first conductive first semiconductor layer (e.g., N-base layer) from the emitter electrode layer via the first conductive third semiconductor layer (e.g., N-source layer) and the MOS channel. As a result, a larger number of electrons are accumulated in the N-base layer, thereby allowing operation with a low on-voltage.

With the nineteenth aspect of the present invention, when the device is turned on, holes are injected into the N-base layer from the second conductive first semiconductor layer (e.g., P-emitter (collector) layer), and are accumulated in the N-base layer. When the device is turned off, the holes thus accumulated are discharged to the emitter electrode layer via the P-base layer. A part of the P-base layer formed in the portions (mesa portions) interposed between the first pseudo groove structure and the second pseudo groove structure is connected to the emitter electrode layer, thereby improving the hole discharge routes. Accordingly, this arrangement is capable of discharging the holes with high speed, which reduces the time required for the turn-off operation, thereby providing the high-speed switching operation. Furthermore, when the device is turned off, the number of holes that flows through the P-base layer portion formed immediately below the N-source layer and discharged to the emitter electrode layer is reduced. This allows the forward bias voltage applied to the pn junction that occurs between the N-source layer and the P-base layer to be maintained at a low level, thereby providing improved latch-up tolerance.

With the twentieth aspect of the present of the present invention, this arrangement provides increased gate capacitance in addition to the MOS gate portion (channel region formation portion), thereby suppressing a noise malfunction.

With the twenty-first aspect of the present invention, this arrangement provides further increased capacitance between the control electrode and the second main electrode, thereby providing a further improved noise malfunction suppressing effect.

With the twenty-second aspect of the present invention, this arrangement allows the plug electrode layer to have a cyclic structure. The processes of fine structure manufacturing up to the plug electrode formation are shared between multiple kinds of insulated gate bipolar transistor devices. Accordingly, this arrangement does not require dedicated process design and dedicated tuning. As a result, this arrangement allows a stock of intermediate-product insulated gate bipolar transistor devices to be prepared and kept in a simpler manner.

With the twenty-third aspect of the present invention, the second conductive second semiconductor layer (e.g., P-base layer) and the first conductive third semiconductor layer (e.g., N-source layer) are layered over the entire area of the device, thereby requiring no mask for forming a fine structure in such layers.

With the twenty-third and twenty-fourth aspects of the present invention, the third electrodes and the fourth electrodes (plug electrodes) are formed such that they reach the interior of the P-base layer, thereby providing an increased contact area. In addition, the hole current flowing through the P-base layer flows into the contact portions without passing through a portion in the vicinity of the N-source layer. This arrangement is capable of suppressing the occurrence of damage due to latch-up in a simple manner.

With the twenty-fifth and twenty-sixth aspects of the present invention, by configuring the mesa portions with a small area ratio, this arrangement is capable of weakening the electric field concentrated at the corners of the main control groove structures (e.g., trench gates) on the first main electrode layer (e.g., collector electrode layer) side.

BRIEF DESCRIPTION OF DRAWINGS

FIGS. 1A and 1B are diagrams each showing a schematic configuration of an IGBT device according to an example 1 according to the present invention, and specifically, FIG. 1A is a diagram showing the overall configuration of the IGBT, and FIG. 1B is an enlarged diagram showing a portion in the vicinity of the trench structures.

FIG. 3 is a diagram showing an example of the plug electrode formation process in the IGBT device manufacturing method according to the example 1 of the present invention, and is a diagram showing the steps up to an emitter electrode layer formation step.

FIGS. 5A and 5B are cross-sectional diagrams showing the structure shown in FIG. 4 as viewed from a direction that differs from those in FIGS. 4A and 4B by 90 degrees.

DESCRIPTION OF EMBODIMENTS

Figure 2:
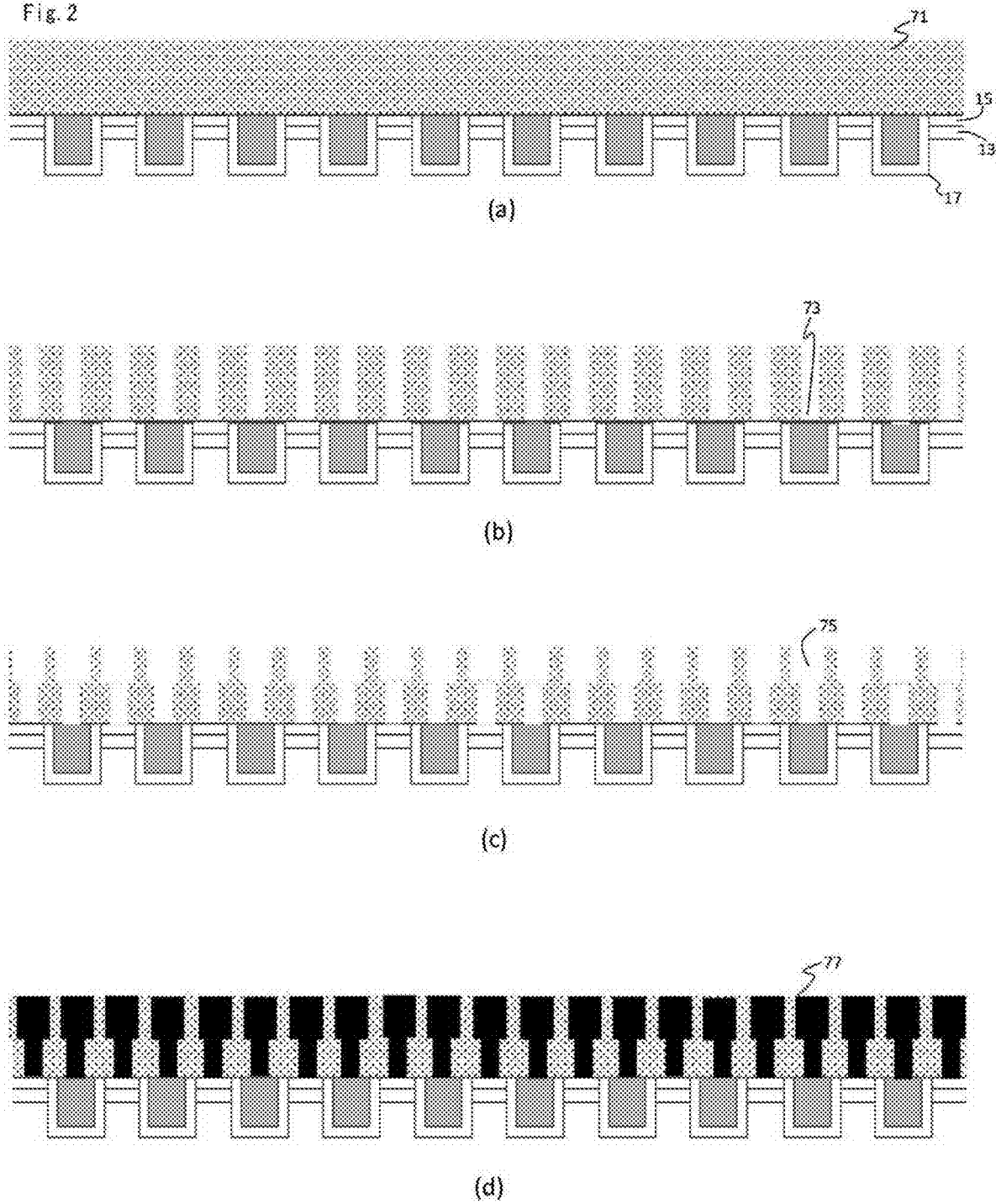
FIG. 2 is a diagram showing an example of a plug electrode formation process in an IGBT device manufacturing method according to the example 1 of the present invention, and is a diagram showing an example of steps up to a wiring formation step in which wiring is formed as an upper layer formed on plugs.

Description will be made regarding examples of the present invention with reference to the drawings. It should be noted that the embodiment of the present invention is not restricted to the examples described below. Also, in some cases, multiple members of the same kind be collectively referred to without an appended suffix.

Example 1

FIG. 1 is a diagram showing a schematic configuration of an IGBT device according to a first example. FIG. 1A is a diagram showing the overall configuration of the IGBT device. FIG. 1B is an enlarged diagram showing a portion in the vicinity of the trench structure. Referring to FIG. 1A, an IGBT device 1 (an example of an "insulated gate bipolar transistor device" in the present claims) includes: a collector electrode layer 3 (an example of a "first main electrode" and a "collector electrode layer" in the present claims); an emitter electrode layer 5 (an example of a "second main electrode" and an "emitter electrode layer" in the present claims); and a gate electrode layer 29 (an example of a "control electrode" and a "gate electrode layer" in the present claims). An N-buffer layer 9 (an example of a "first conductive second semiconductor layer" and a "first conductive buffer layer" in the present claims) is formed in an N-base layer having a large thickness between the collector electrode layer 3 and the emitter electrode layer 5 such that it is closer to the collector electrode layer 3 side. A P-emitter layer 11 (an example of a "second conductive first semiconductor layer" and a "second conductive emitter layer" in the present claims) is formed between the N-buffer layer 9 and the collector electrode layer 3. An insulating layer 12 is formed between the N-base layer 7 and the emitter electrode layer 5. A P-base layer 13 (an example of a "second conductive second semiconductor layer" and a "second conductive base layer" in the present claims) is formed in the N-base layer 7 such that it is closer to the emitter electrode layer 5 side. An N-source layer 15 (an example of a "first conductive third semiconductor layer" and a "first conductive source layer" in the present claims) is formed on the emitter electrode layer 5 side surface of the P-base layer 13. The P-base layer 13 and the N-source layer 15 are each configured to have a stripe-shaped pattern. Trench structures 17 (an example of a "groove structures" and a "trench structures" in the present claims) are each formed such that they is in contact with the N-source layer 15 and the P-base layer 13 along a direction that intersects with the stripe direction of the N-source layer 15 and such that they extend from the surfaces of the N-source layer 15 and the P-base layer 13 up to the N-base layer 7. A thin insulating film 19 (an example of an "insulating film" in the present claims) is formed along an inner surface (an example of a "surface of a conductive region other than the surface of the second main electrode side" and a "surface of the trench portion other than the surface of the emitter electrode layer side" in the present claims). The insulating film 19 is configured as a silicon oxide film, for example. An electrode 21 (an example of a "conductive material region" and a "trench portion" in the present claims) is embedded in the insulating film 19. The electrode 21 is configured as a polycrystalline silicon portion (or polysilicon portion, and an example of a "semiconductor material" in the present claims), for example. Multiple trench structures 17 are formed such that they extend in approximately parallel with each other.

An individual plug electrode 23 is formed on the surface of each of the N-source layer portions 15 and the P-base layer portions 13, which are alternately and repeatedly arranged in the longitudinal direction of the trench structures 17 (an example of the "longitudinal direction" in the present claims, which indicates the direction approximately orthogonal to the drawing) such that each plug electrode 23 interposed between the adjacent trench structures 17. Furthermore, a plug electrode 25 is formed on the emitter electrode layer side surface of the electrode 21 configured as an internal portion of the trench structure 17. Such a structure in which the N-source layer 15 and the P-base layer 13 are alternately formed on the emitter electrode layer side surface also provided between adjacent dummy trenches 35 in addition to a trench gate 18 and the dummy trench 35.

Referring to FIG. 1B, the cell pitch is designed to be approximately 10 to 20 μm. One trench structure 18 is selected for every cell pitch. A gate electrode layer 29 (an example of a "main control conductive material region" and a "gate trench portion" in the present claims) of the trench structure 18 thus selected is provided with a plug electrode 31 configured as a contact electrode formed of copper using the dual damascene process, for example. A wiring portion 33, which is an upper layer of the plug electrode 31, is drawn the longitudinal direction of the trench structure. The trench structure 18 (an example of a "main control groove structure" and a "trench gate" in the present claims) functions as a trench gate. The wiring portion thus drawn as an upper layer of the plug electrode 31 layer is connected to each gate pad (not shown in FIG. 1) which is a terminal of the gate electrode layer formed on the chip surface via a via hole (not shown in FIG. 1) formed as a through hole formed in the interlayer insulating film 12 configured as an upper film of the wiring portion 33 layer.

The trench structures $35_1$ through $35_3$ having no function as a trench gate will be referred to as dummy gates or dummy trenches. The electrodes 37 configured as internal portions of the dummy gates 35 are drawn via the plug electrodes 39 and the wiring portions $41_1$ through $41_3$ configured as an upper layer of the plug electrodes 39 in the same manner, and are connected to the emitter electrode layer 5. The dummy gate $35_1$ is an example of a "first pseudo groove structure" and a "first dummy trench" in the present claims. The dummy gate $35_2$ is an example of a "second pseudo groove structure" and a "second dummy trench" in the present claims.

Figure 8:
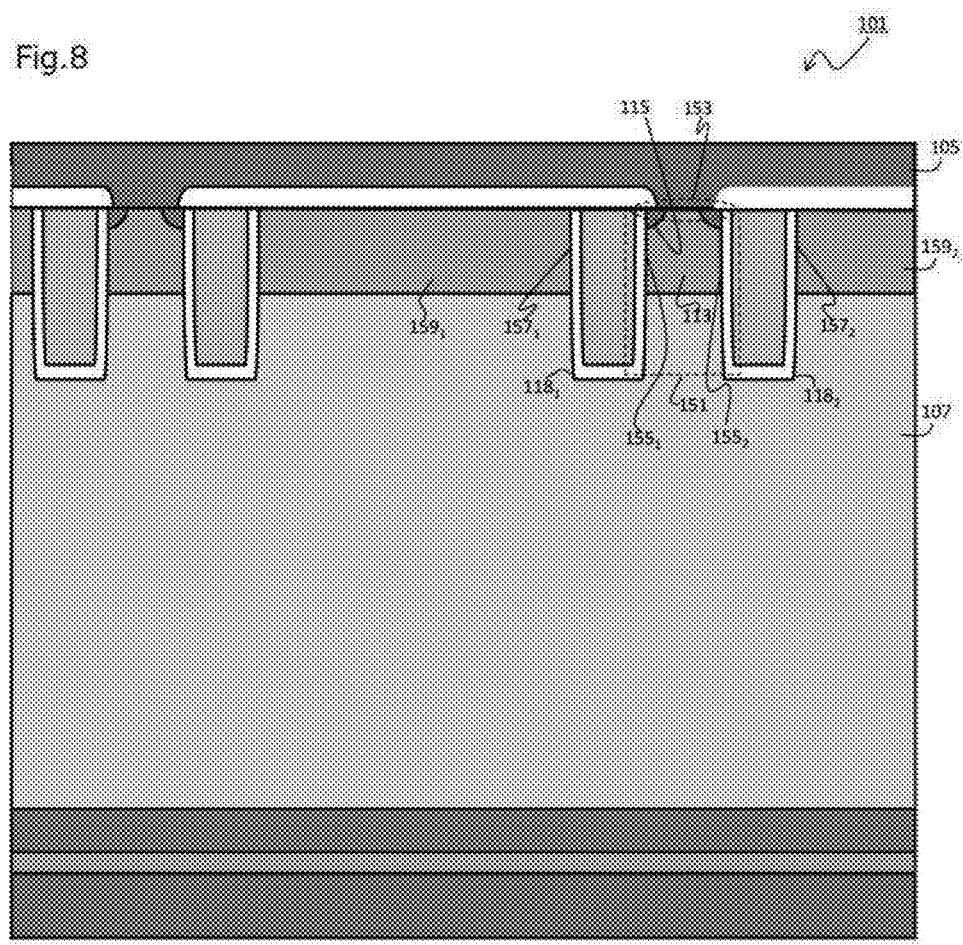
FIG. 8 is a diagram showing another example of a schematic configuration of a conventional insulated bipolar transistor device.

Here, for comparison, description will be made regarding a configuration of a conventional IGBT device that differs from that described in the related art. FIG. 8 is a diagram showing a different example of a schematic configuration of a conventional IGBT device 101.

Referring to FIG. 8, the IGBT device 101 includes a P-base layer 113 and an N-source layer 115 in a region 151 interposed between two trench gates $118_1$ and $118_2$. Furthermore, the one-side walls $155_1$ and $155_2$ of the two trench gates $118_1$ and $118_2$ are employed as a gate of a MOS structure for each emitter electrode layer contact $15_3$, which is a contact between a metal electrode connected to the emitter electrode layer 105 and the P-base layer 113 and the N-source layer 115. The opposite faces (outer-side faces) $157_1$ and $157_2$ are arranged such that they are in contact with a floating P-type layer, i.e., P-type floating layer portions $159_1$ and $159_2$.

With this structure, a parasitic MOS structure that does not operate as a MOS gate is formed between the trench gate 118 and the floating P-type layer 159. Accordingly, this arrangement requires a gate capacitance that is approximately twice the gate capacitance that is required to operate a MOS gate in the IGBT driving operation. This leads to the gate operation speed becoming slower.

Furthermore, the electrically floating P-type layer 159 is not connected to the emitter electrode layer 105 or the like. This is because, in a case in which the electrically floating P-type layer 159 is connected to the emitter electrode layer 105 or the like, in the IGBT conduction state, holes accumulated in the N-base layer 107 are discharged, leading to degradation of conduction performance. Accordingly, in the floating P-type layer 159, an electric potential suddenly changes when the IGBT performs a switching operation. Such a sudden change in the electric potential involves a change in the electric potential at a polysilicon portion 121 provided within the trench gate 118 via a parasitic MOS structure arranged such that it is in contact with the floating P-type layer 159. As a result, this causes oscillation when the gate voltage is short-circuited. Also, this causes noise generation or damage that occurs due to the dI/dt waveform becoming steep, which is a change of current due to a surge of the gate voltage when the IGBT is turned on.

Returning to FIG. 1B, in the present invention, the N-source layer portions $15_2$ and $15_3$ are arranged on both sides of each trench gate 18, which are connected to the emitter electrode layer 5 via plug electrodes $32_2$ and $32_3$ (an example of a "first electrode" and a "first plug electrode" in the present claims). With this arrangement, the left-side and the right-side side walls $57_1$ and $57_2$ defined by the trench gate 18 each provide a MOS transistor structure including the N-source layer 15, the P-base layer 13, and the N-base layer 7. That is to say, such an arrangement involve no parasitic MOS structure. Accordingly, such an arrangement is capable of avoiding the problem had by conventional IGBTs. Furthermore, the N-source layer portions $15_2$ and $15_3$ on both sides of the trench gate 18 are connected to the emitter electrode layer 5. Such an arrangement has advantages of suppressing wiring resistance and electromigration.

Plug electrodes $45_2$ and $45_3$ (an example of a "second electrode" and a "second plug electrode" in the present claims) formed on the surfaces of the P-base layer portions 13 arranged such that they are in contact with the respective sides of the trench gate 18 are also connected to a pad-shaped emitter electrode layer 5 (emitter pad) formed on the upper face of the chip. The plug electrodes are configured as a copper wiring layer using the dual damascene process, for example. In order to provide a reliable electrical connection, the wiring portion 27 arranged as the upper layer of the plugs is preferably connected along the longitudinal direction of the trench gate. The wiring portion 27 configured as an upper layer of the plugs is connected to the emitter electrode layer 5 configured as an uppermost layer via a via hole 43 formed as a through hole in an interlayer insulating film arranged as an upper layer of the wiring portion 27.

In a case of employing such plug electrodes using the copper damascene method, this arrangement has advantages of suppressing electromigration and conduction voltage drop that can occur in the wiring when high current density occurs in the plug electrode portion. For example, in a case in which the IGBT is designed such that a trench structure is employed to function as a gate for every cell pitch L (e.g., 20 μm), such that each trench structure is formed with a pitch W (1.5 μm), such that the N-source layer portions are arranged with a repeating pitch Z (as shown in FIG. 5A, 1.5 μm, for example) in a direction that is orthogonal to the drawing, and such that the ratio of the trench pitch W with respect to the plug diameter is N (e.g., 6), the current density J' that represents the current flowing through the plug is represented by the following Expression (1) with respect to the chip current density J when the IGBT is operated.

[Expression 1]

$$J' = 2\frac{N^2 \cdot L \cdot Z}{\pi W^2} J \quad (1)$$

As a result of estimation based on the value as described for exemplary purposes, it can be assumed that the current density that occurs in the plug is on the order of 300 times the chip current density. In a case in which a current density of 2000 A/cm$^2$ occurs in the IGBT (short-circuited state or current concentration state), for example, the current density that occurs in the plug electrode approaches 10$^6$ A/cm$^2$, which increases the potential to cause a problem of degradation of reliability due to electromigration. Here, typically, such electromigration has been observed by experiment under current density conditions on the order of 10$^5$ A/cm$^2$ up to 10$^6$ A/cm$^2$. Furthermore, it is assumed that such IGBTs are used at a temperature of 200° C. due to the high current density involved in the IGBTs, leading to an increase in the potential to cause migration. Accordingly, in a case in which the wiring is formed of aluminum or the like, the coefficient defined in Expression (1), i.e., k in Expression (2), is preferably designed to be 50 or less.

[Expression 2]

$$k = 2\frac{N^2 \cdot L \cdot Z}{\pi W^2} \quad (2)$$

However, in a case of k that is equal to or smaller than 50, such an arrangement cannot provide a high-performance IGBT having a fine structure. In contrast, in a case of employing a structure according to the present invention using copper wiring (copper damascene method or the like), such an arrangement is capable of suppressing the occurrence of migration even if k is 50 or more. Furthermore, in a case in which k is 500 or more without using copper wiring (copper damascene method or the like), in all cases, such an arrangement involves the occurrence of migration, easily leading to a breakdown of the device. It should be noted that the current density J' of an IGBT having a conventional structure is twice that of the IGBT structure according to the present invention. Accordingly, the IGBT structure according to the present invention has an advantage of suppressing the occurrence of migration.

In many cases, an IGBT is designed with a cell pitch L on the order of 10 to 20 μm (16 μm in Non-patent documents 3 and 4). In this case, in a case in which the product of the trench pitch C and the pitch Z of the N-source layer portions is equal to or smaller than 49 μm$^2$, wiring for the N-source layer portions is preferably formed as copper wiring (copper damascene method or the like). In a case in which the product thus calculated is equal to or smaller than 1 μm$^2$, the copper wiring (copper damascene method or the like) is necessary to provide improved reliability.

As described above, in a case in which the trench gates, the center-to-center distance W (an example of a "center-to-center distance" in the present claims) between the adjacent trenches, and the width of each N-source layer are designed with a fine size, it can be assumed that this leads to a reduction in the width of a silicon portion interposed between the adjacent trenches with respect to the trench width d (an example of a "trench width" in the present claims). This accelerates the accumulation of holes, leading to an increase of N in Expression (1). As a result, in a case in which the IGBT is designed with a finer size, the migration problem becomes more serious. In contrast, it has been known that a copper material has migration suppressing performance that is 40 times that provided by an aluminum material. The copper wiring technique is necessary for IGBTs having a fine structure.

It should be noted that, in a case in which the IGBT is designed to have a conventional structure with a fine size, this requires each contact portion for the N-source layer to be designed with half the size. In this case, the electromigration problem becomes more serious.

Here, a polysilicon portion $37_1$ (an example of a "first pseudo conductive material region" and a "first dummy trench portion" in the present claims) of the dummy gate $35_1$ is connected to the emitter electrode layer 5. Furthermore, a polysilicon portion $37_2$ (an example of a "second pseudo conductive material region" and a "second dummy trench portion" in the present claims) is also connected to the emitter electrode layer 5.

The electric potential at the P-floating layer (floating P-type layer) is maintained at almost the same as the gate voltage due to a mechanism described below. Accordingly, such an arrangement has no problem of the occurrence of degradation of the breakdown voltage or device damage due to the rise of the electric field between the P-floating layer and the gate or a P-base even if the voltage at the P-floating layer rises.

Description will be made below regarding the mechanism which limits the voltage at the P-floating layer to a voltage on the order of the gate voltage. When the voltage at the P-floating layer rises, and becomes a predetermined value that is higher than that at the polysilicon portion of the adjacent trench gate, this involves the occurrence of an inversion layer. In this case, the charges (holes) flow from the P-floating layer to the P-base layer. That is to say, the P-floating layer (P-source), the N-base layer (N-well layer), the P-base layer (P-drain), the trench oxide film (gate insulating film), and the polysilicon portion (gate electrode) form a P-channel MOSFET. When the electric potential at the P-floating layer becomes higher than that at the polysilicon portion, the MOSFET thus formed is turned on, thereby limiting the electric potential at the P-floating layer.

With the dummy gates, the effect described above does not occur. Accordingly, the polysilicon portion provided within each dummy gate is required to be set to the same electric potential as that at the emitter. If the polysilicon portion is set to a floating state (a state in which it is not connected to an electrode), the voltage at the polysilicon portion provided in the dummy gate rises according to the capacitance (capacitor) voltage dividing ratio that occurs between the collector electrode layer and the emitter electrode layer. This involves the occurrence of high voltage applied between the adjacent gate electrodes. As a result, this causes electric field concentration, leading to degraded breakdown voltage performance or element breakdown.

It should be noted that, in a case in which the polysilicon portion provided within the dummy gate is connected to the gate, such an arrangement does not involve the degraded breakdown voltage performance. However, this arrangement involves a marked increase in the gate capacitance between the gate and emitter. This involves an increase in the charge/discharge time for the gate capacitance, leading to reduction in the operation speed. Furthermore, this increases the capacitance between the collector and the gate. Accordingly, the change in the collector voltage has an effect on the gate voltage via the capacitance, which causes a malfunction or switching noise.

In a case in which a plug electrode is arranged such that it is in contact with the surface of the N-source layer that is not in contact with any one of both sides of any trench gate, i.e., such that it is in contact with the surface of the N-source layer interposed between the dummy gates, the plug electrode is not electrically connected via wiring to the emitter electrode layer or any electrode or plug connected to the P-base layer.

In a case in which such an N-source layer interposed between the dummy gates is connected to the emitter electrode layer, this forms a parasitic thyristor in the device structure, which causes a malfunction due to latch-up. In particular, the electric potentials at the adjacent P-base surfaces are not fixedly defined. Accordingly, the P-base electric potential at a portion interposed between the dummy gates is in a floating state, thereby having high probability to involve a malfunction due to latch-up.

In a case in which the N-source layer interposed between the dummy gates is electrically connected to the adjacent P-base layer via the plug and its upper wiring layer, for example, electrons and holes accumulated in the N-base when the IGBT is turned on both flow into the N-source layer and the P-base layer. Accordingly, this leads to reduction in the accumulation of the electrons and holes (carriers) in the N-base layer.

Also, in some cases, the P-base layer is connected to the emitter via a P-base diffused layer formed in an unshown portion (end portion of each trench in the depth direction or the like). In this case, this arrangement has the potential to cause a malfunction.

Such plug electrodes are not required to provide any electrical operation. However, the plug electrodes provide the following two advantages.

The first advantage is improved heat radiation performance. With the IGBT chip, heat generation is large at an upper portion of each silicon portion. However, typically, heat is radiated from the bottom face. That is to say, there has been no idea to use the wiring provided to the upper face of the chip for heat radiation. In the future, it is conceivable that cooling will be performed for both the front and back faces of the chip. In order to conduct heat to the uppermost electrode with high efficiency, as large a number or contact electrodes as possible are preferably provided to the silicon surface, and the contact electrodes are preferably arranged such that they are as close to the upper face electrode as possible in order to conduct heat with high efficiency. In the present example, the plugs are arranged such that they extend up to immediately below the interlayer insulating film formed as a lower layer of the emitter electrode layer. This arrangement is capable of conducting heat that occurs on the silicon surface to the emitter electrode layer with high efficiency.

The second advantage is reduced design, development, and manufacturing costs. The portion lower than the wiring portion arranged above the plugs can be employed as a common structure. On the other hand, the chip characteristics can be tuned, i.e., the cell pitch of the IGBT structure can be selected by selecting the portions of the uppermost interlayer insulating film to be etched. Accordingly, with this arrangement, the steps before the upper interlayer insulating film etching can be designed as common steps that can be shared between a chip designed with a higher priority level placed on the low power loss performance and a chip designed with a higher priority level placed on the high-speed operation. This enables a stock of intermediate-product wafers completed up to the common structure formation steps to be prepared and to be kept. This arrangement requires only a modification of the uppermost metal mask to manufacture a device tuned according to the device performance requested by the customer. Furthermore, the process for a fine structure belongs to the common process. Accordingly, individual process design and tuning are not required for each device. This allows the design and development period to be reduced. Furthermore, this allows the common process to be shared between various kinds of devices. Accordingly, this allows costs to be reduced.

FIGS. 2 and 3 show a plug electrode formation step. As an example, a copper dual damascene step is shown. First, a P-base layer is formed in an N-base layer (an example of a "second conductive base layer formation step" in the present claims). Furthermore, an N-source layer is formed in a stripe shape as an internal portion of the P-base layer portion (an example of a "first conductive source layer formation step" in the present claims). Subsequently, multiple trench structures are formed in a cyclic manner such that each trench structure is in contact with the N-source layer and is configured as a through hole formed in the P-base layer and extending up to the N-base layer, and such that they extend in a direction that is approximately orthogonal to the longitudinal direction of the N-source layer and in parallel with each other (as viewed from the chip surface) (an example of a "trench formation step" in the present claims). In the present example, the N-source layer is formed for all the P-source layer portions each formed between the adjacent trench structures. This is because such an arrangement supports various kinds of chip designs.

Next, referring to FIG. 2, in Step ST001, an interlayer insulating film 71 is formed on the wafer surface on which trench structures 17 have been formed (FIG. 2A). In Step ST002, gaps 73 are formed for forming the plug electrodes 23 (FIG. 2B). In Step ST003, etching is performed for forming gaps 75 for forming the wiring portions 27 arranged as an upper layer of the plug electrodes (FIG. 2C). In Step ST004, copper plating is performed (an example of a "plug electrode layer formation step" in the present claims). Furthermore, the surface 77 is subjected to flattening processing by CMP (Chemical Mechanical Polishing) (an example of a "polishing step" in the present claims) (FIG. 2D).

Referring to FIG. 3, in Step ST005, an interlayer insulating film 79 is further formed on the surface 77 thus subjected to the flattening processing (FIG. 3A). In this stage, the semiconductor device has a cyclic structure with the distance W between the adjacent trench structures as the repeating unit. The semiconductor device completed up to Step ST005 is an example of a "semiconductor device" in the present claims.

In a case assuming that the chip design has been determined, in Step ST006, etching is performed to form gaps 83 each of which is formed for a via hole 43 to be used to connect the emitter electrode layer 5 and a plug electrode 81 that is in contact with the N-source layer 15 and the P-base layer 13 (FIG. 3B). In Step ST007, the emitter electrode layer 5 is formed by copper plating. In this stage, the emitter electrode layer 5 is connected to a lower layer via the etched portions (FIG. 3C). As described above, a part of the multiple plug electrodes formed in Step ST004 is connected to the emitter electrode layer combination of Steps ST006 and ST007 is an example of an "emitter wiring structure formation step" in the present claims.

Figure 4:
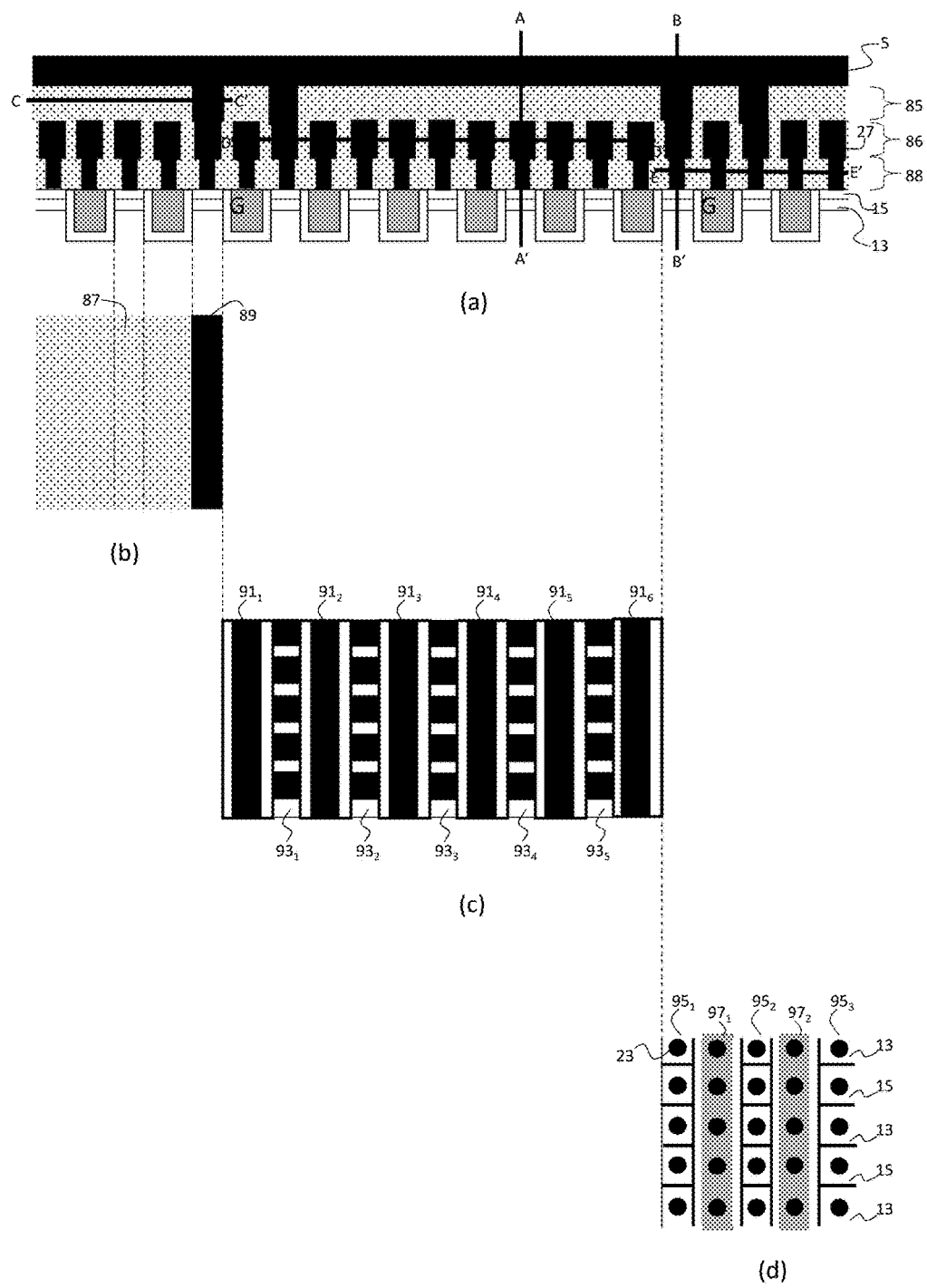
FIG. 4A is a cross-sectional diagram showing a part of a structure of the IGBT device 1 on the emitter electrode layer side thereof according to the example of the present invention.
FIG. 4B is a diagram showing a plan view of the layout thereof.

FIG. 4A is a structure cross-sectional diagram showing a part of the emitter electrode layer 5 side of the IGBT device 1 according to the present invention as viewed from the emitter electrode layer 5 side. FIGS. 4B through 4D are cross-sectional diagrams each showing the interlayer insulating film 12 as viewed from the emitter electrode layer 5. Specifically, FIG. 4B is a cross-sectional diagram taken along the line C-C' that passes through the via holes 43. FIG. 4C is a cross-sectional diagram taken along the line D-D' passing through the wiring portions 27. FIG. 4D is a diagram taken along the ling E-E' passing through a layer including the plug electrodes 23.

Referring to FIG. 4B, in a layer 85 in which the via holes 43 have been formed (an example of an "insulating layer" in the present claims), a portion 87 that corresponds to a region interposed between two dummy gates 354 and 355 is filled with an insulating film. However, a via hole 43 is formed in portion 89 that corresponds to region interposed between a trench gate $18_2$ and an adjacent dummy gate $35_5$.

Referring to FIG. 4C, in a layer 86 including the wiring portions 27, portions $91_1$ through $91_6$ that correspond to all the trench structures are designed as a common wiring structure, which are drawn to the far side or otherwise the near side along a direction that is orthogonal to the drawing. It should be noted that the portion $91_1$ that corresponds to the trench gate $18_2$ is connected to a gate electrode pad via wiring at an end portion of the far side or the near side. In contrast, the portions $91_2$ through $91_6$ that correspond to the dummy gates are connected to the emitter electrode layer 5 via wiring at an end portion thereof.

Furthermore, portions $93_1$ through $93_5$ each of which corresponds to a region interposed between the trench structures are connected such that the N-source layer 15 and the P-base layer 13 are not electrically connected, i.e., such that they are electrically insulated from each other. A part of the portions, i.e., the portion $93_1$ that corresponds to a region interposed between the trench gate $18_2$ and the dummy gate $35_6$ is connected to the emitter electrode layer 5 at its end portion. On the other hand, the portions $93_2$ through $93_5$ each of which corresponds to a region interposed between the dummy gates are connected to neither the gate electrode layer nor the emitter electrode layer 5. Accordingly, the portions $93_2$ through $93_5$ are each set to an electrically floating state.

Referring to FIG. 4D, in a layer 88 in which the plug electrodes 23 have been formed (an example of a "plug electrode layer" in the present claims), individual plug electrodes 23 are formed in the P-base layer 13 and the N-source layer 15 for each of portions $95_1$ through $95_3$ that correspond to all the regions which are interposed between the corresponding trench structures. Furthermore, the portions $97_1$ and $97_2$ each corresponding to the trench structure are also provided with plug electrodes 23 each formed in the same shape as those provided to the P-base layer 13 and the N-source layer 15. This allows the etching to be performed for forming the gaps 73 for the plug electrodes 23 without concern about the difference between the portion 95 interposed between the trench structures and the portion 97 that corresponds to the trench structure.

As described above, the layer 88 including the plug electrodes 23 and the layer 86 including the wiring portions are each configured to have a common cyclic structure regardless of the positions of the trench gates and the dummy gates except for their end portions. On the other hand, only the layer 85 on which the via holes 43 are formed is not configured as such a common structure. That is to say, in the layer 85 in which the via holes 43 are to be formed, the via holes 43 are formed in only the regions adjacent to the trench gates 18.

The IGBT device 1 according to the present invention has such a structure as described above. This allows a stock of intermediate products on which the common structure layer including the wiring portion 27 layer or the interlayer insulating film 79 layer have been formed to be prepared and to be kept even before determining which from among the trench structures 17 are to be the trench gates 18. In order to manufacture the IGBT device 1, this requires only the step for forming the layer 85 including the via holes 43 and the subsequent steps to be performed after the design has been completed, thereby dramatically reducing the time up to shipping.

FIG. 5A is a cross-sectional diagram taken along the line A-A' in FIG. 4A, passing through a region interposed between the two dummy gates $35_1$ and $35_2$. FIG. 5B is cross-sectional diagram taken along the line B-B' in FIG. 4A, passing through a region interposed between the trench gate $18_1$ and the adjacent dummy gate $35_3$.

Referring to FIG. 5A, in the portion that corresponds to the region interposed between the two dummy gates $35_1$ and $35_2$, a wiring portion $27_1$ is connected to the P-base layer 13 via a plug electrode $45_1$ (an example or a "third plug electrode" and a "fourth plug electrode" in the present claims). Furthermore, a wiring portion $27_2$ is connected to the N-source layer 15 via a plug electrode $32_1$ (an example of a "third plug electrode" in the present claims). The wiring portion $27_1$ and the wiring portion $27_2$ are electrically insulated from each other. Furthermore, the wiring portions $27_1$ and $27_2$ are electrically insulated from the gate electrode layer and the emitter electrode layer 5. As a result, the P-base layer 13 and the N-base layer 15 are each individually set to a floating electric potential. This provides improved electron injection efficiency and reduced conduction loss. Furthermore, this arrangement is capable of suppressing a malfunction due to latch-up or the like.

On the other hand, referring to FIG. 5B, in a portion that corresponds to a region interposed between the trench gate $18_1$ and the adjacent clammy gate $35_3$, all the plug electrodes are connected to the emitter electrode layer 5. Accordingly, both the P-base layer 13 and N-source layer 15 are set to the emitter electric potential.

Example 2

FIGS. 6A and 6B show a cross-sectional view of a structure of another example and a planar layout thereof. Specifically, FIG. 6A is a cross-sectional view of the structure. FIG. 6B is a cross-sectional diagram showing the interlayer insulating film 12 as viewed from the emitter electrode layer 5 side, and showing a cross-sectional view taken along the line F-F' extending along a layer including the plug electrodes 23.

Figure 6:
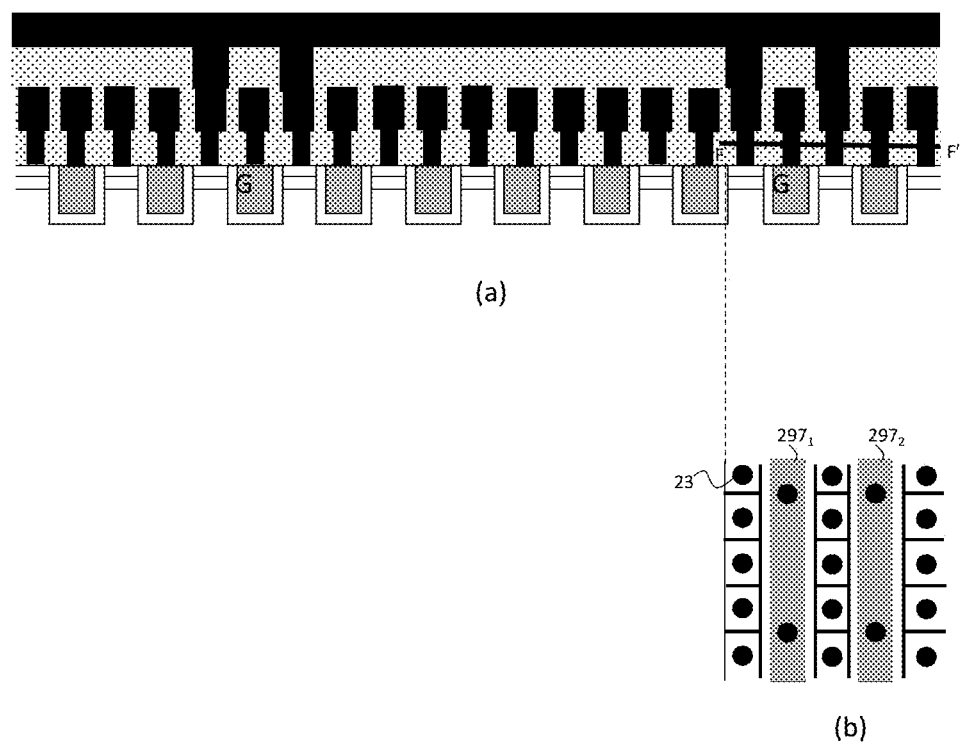
FIG. 6 is a diagram showing a layout according to an example 2.

Referring to FIG. 6, in the present example, portions $297_1$ and $297_2$ each corresponding to the trench structure are provided with the plug electrodes connected to the polysilicon portions of the trench gate and the dummy gate with a density that is lower than that of the plug electrodes each configured as a contact for the N-source layer or the P-base layer.

The current that flows through the gate electrode layer is very small compared to the current that flows through the emitter electrode layer. Accordingly, the reduction of the number of contacts for the gate electrode layer involves no problem with respect to the gate driving operation.

Furthermore, it can be expected that such an arrangement provides an improved copper embedded structure configured as an upper wiring layer of the plug electrode layer. The connection to the emitter electrode layer is provided in the upper-lower direction. This reduces the potential to cause a problem due to the wiring layer provided as an upper layer of the plugs. In contrast, the gate wiring is drawn such that it extends for a long distance in the horizontal direction (direction that is orthogonal to the drawing in FIG. 6). Accordingly, a problem of the upper wiring layer on the plug portions directly leads to a problem of the chip. Accordingly, it can be expected that, by reducing the number of the gate wiring portions, this arrangement provides improved yield.

Example 3

Figure 7:
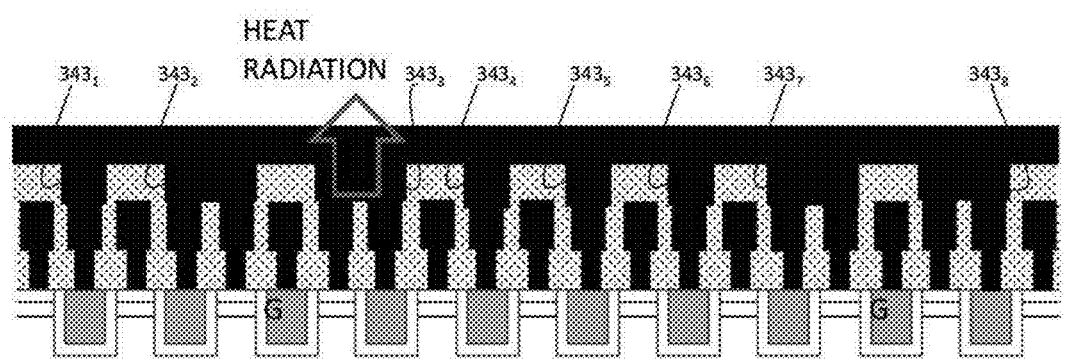
FIG. 7 is a diagram showing a layout according to an example 3.

FIG. 7 shows a cross-sectional view of another wiring structure according to the present invention.

In the present example, the plugs connected to the polysilicon portions provided within the dummy gates are directly connected to the uppermost emitter electrode layer (emitter pad) along a direction that is orthogonal to the emitter electrode layer side surface of the N source layer via via holes $343_1$ through $343_8$ (an example of a "normal direction" in the present claims) without being drawn to the wafer end portion from the wiring layer formed on the upper face of the plug layer. This arrangement provides improved heat radiation performance via the dummy trenches.

Example 4

Figure 9:
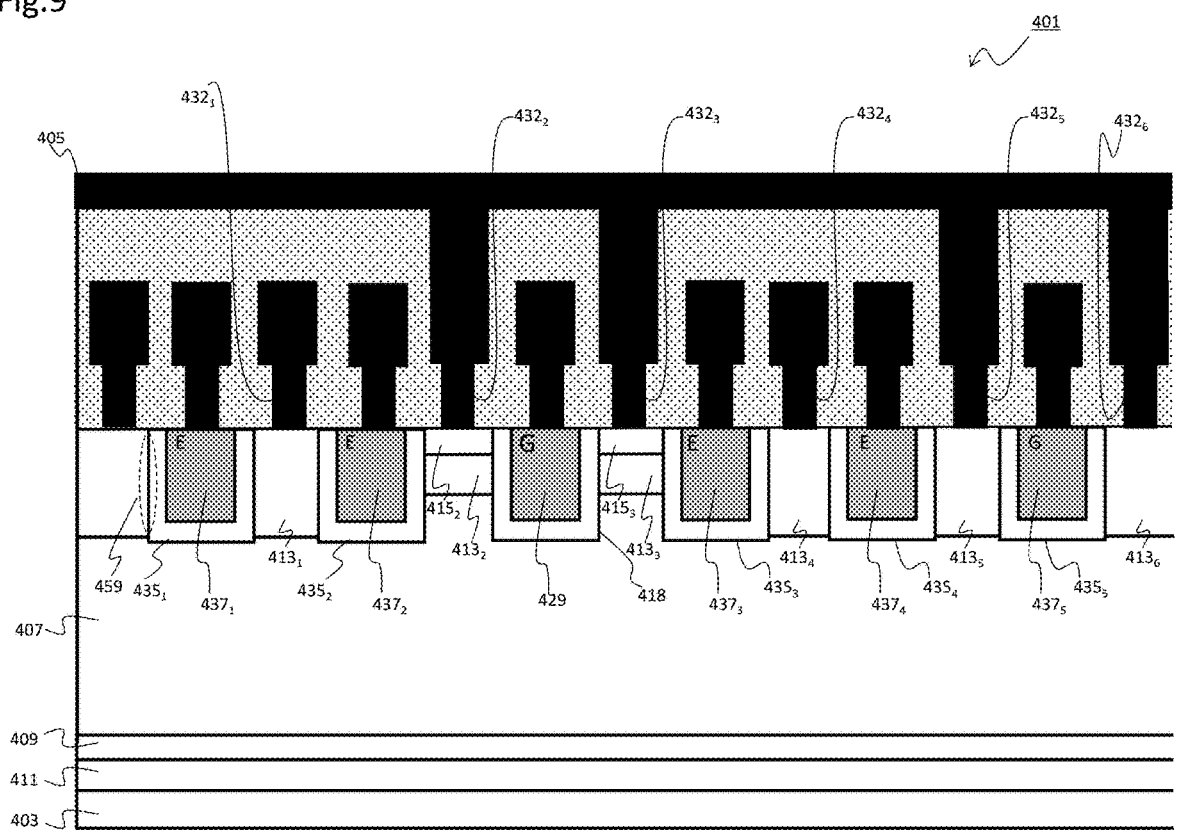
FIG. 9 is a diagram showing a schematic configuration of an IGBT device according to an example 4.

FIG. 9 is a diagram showing a schematic configuration of an IGBT device according to an example 4.

The point of difference between an IGBT device 401 according to the present example and the IGBT device 1 according to the example 1 is that, in the IGBT device 401, a portion interposed between dummy gates $435_1$ and $435_2$ is provided with only a P-base layer $413_1$ and no N-source layer. This arrangement allows such a portion (mesa) interposed between the dummy gates to involve no parasitic thyristor (pnpn four-layer structure) between it and the emitter electrode layer 405 and between it and the collector electrode layer 403. Accordingly, this arrangement allows such a portion to involve no latch-up operation. This provides improved latch-up tolerance as a performance of the insulated gate bipolar transistor device itself, thereby providing a stable operation.

Furthermore, the plug electrode $432_1$ connected to the P-base layer $413_1$ provided to the portion (mesa) interposed between the dummy gates $435_1$ and $435_2$ is not directly connected to the emitter electrode layer 405. In this arrangement, the difference in electric potential between the emitter electrode layer 405 and the P-base layer $413_1$ becomes large. Accordingly, upon turning on the device, electrons are effectively injected into the N-base layer 407 from the emitter electrode layer 5 via the N-source layer portions $415_2$ and $415_3$ and a MOS channel. This arrangement allows the number of electrons accumulated. In the N-base layer 407 to be increased, thereby enabling a low on-voltage.

Furthermore, a plug electrode $432_5$ connected to a P-base layer $413_5$ provided to a portion (mesa) interposed between dummy gates $435_4$ and $435_5$ is directly connected to the emitter electrode layer 405. With this arrangement, upon turning on the device, holes are injected into the N-base layer 407 from the P-emitter layer 411, and are accumulated n the N-base layer 407. Upon turning off, the holes thus accumulated are discharged to the emitter electrode layer 405 via the P-base layer $413_5$. That is to say, the plug electrode $432_5$ connected to the P-base layer $413_5$ is directly connected to the emitter electrode layer 405. This improves the hole discharge route, thereby allowing holes to be discharged with high speed. Accordingly, this arrangement allows the time required for the turn-off operation to be reduced, thereby providing a high-speed switching operation. Furthermore, this arrangement is capable of reducing the number of holes discharged to the emitter electrode layer 405 via the P-base layer portions $413_2$ and $413_3$ provided as a layer immediately below the N-source layer portions $415_2$ and $415_3$ in the turn-off operation. Accordingly, this arrangement allows a forward bias voltage applied to pn junctions that occur between the N-source layer portions $415_2$ and $425_3$ and the P-base layer portions $413_2$ and $413_3$ to be maintained at a low level, thereby providing improved latch-up tolerance.

Furthermore, an internal electrode $437_5$ of the dummy gate $435_6$ interposed between the P-base layer portions $413_5$ and $413_6$ directly connected to the emitter electrode layer 405 is connected to the gate electrode layer 429. Accordingly, in addition to the MOS gate portion that forms a channel region, this arrangement increases the gate capacitance, thereby allowing a noise malfunction to be suppressed.

Furthermore, the region 459 of the P base layer 413 that is in contact with at least one dummy gate 435 is configured with depth level that is approximately the same as the dummy gate 435. This allows the gate-emitter capacitance to be further increased, thereby providing improved noise malfunction suppressing effects. It should be noted that, in the same manner, the regions of the P-base layer portions $413_2$ and $413_3$ that are each in contact with the trench gate 418 may each be configured with a depth level that is approximately the same as that of the trench gate 418.

"Approximately the same depth" as used here is preferably designed to be 90% or more of its reference. It should be noted that the P-base layer 413 adjacent to the dummy gate may be configured with a depth that is smaller than that of the dummy gate 435 in a case in which this arrangement involves no problem of such a noise malfunction.

Example 5

Figure 10:
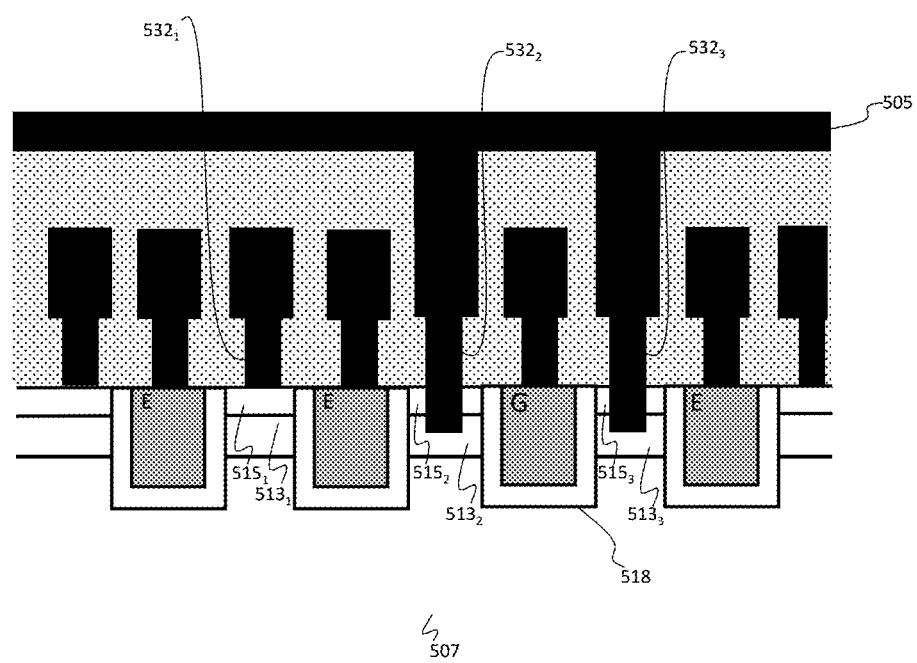
FIG. 10 is an enlarged diagram showing a portion in the vicinity of the trench structures in a structure of an IGBT device according to an example 5.

FIG. 10 is an enlarged diagram showing a portion in the vicinity of a trench structure of an IGBT device structure according to an example 5.

The point of difference between an IGBT device 501 according to the present example and the IGBT device 1 according to the example 1 is that, in the IGBT device 501, plug electrodes $532_2$ and $532_3$ (an example of a "third electrode" and a "fourth electrode" in the present claims) connected to an emitter electrode layer 505 are configured such that they respectively pass through N-source layer portions $515_2$ and $515_3$ adjacent to a trench gate 518 and respectively reach P-base layer portions $513_2$ and $513_3$. It should be noted that the plug electrodes $532_2$ and $532_3$ are configured such that they do not reach an N-base layer 507. That is to say, the plug electrodes $532_2$ and $532_3$ are respectively connected to the N-source layer portions $515_2$ and $515_3$ via their side walls, and are respectively connected to the P-base layer portions $513_2$ and $513_3$ via their side walls and bottoms. This increases the contact area between the plug electrodes and the N-source layer and P-base layer, thereby securing the contact connection in a sure manner. Furthermore, this allows the hole current flowing through the P-base layer to flow into the plug electrode without passing through a portion in the vicinity of the N-source layer, thereby reducing the potential to cause damage due to latch-up.

Furthermore, by forming the plug electrodes after the P-base layer and the N-source layer are layered over the entire area, this arrangement allows the P-base layer and the N-source layer to be patterned in a simple manner. This allows a fine structure to be manufactured in a simple manner. It should be noted that, as shown in FIG. 4C, the P-base layer and the N-source layer may be configured such that they are alternately exposed to the emitter electrode layer 505 side is the longitudinal direction of the trench structures.

It should be noted that the other plug electrodes that are not adjacent to the trench gate 518 may be configured such that they pass through the P-base layer or the like. This arrangement allows the plug electrodes to be formed without differentiating the plug electrode formation layout, thereby facilitating the plug electrode formation.

It should be noted that, in each of the examples of the present invention, by reducing the area ratio of the mesa portion having no trench structure, this arrangement raises the potential to weaken the electric field concentrated at the corners of the lower portion of each trench gate. For example, the mesa portion is preferably configured with an area that is 30% or less of the effective device area. Also, the mesa portion is preferably configured with a width of 0.5 μm or less.

Also, the trench gates may be configured with an aspect ratio (trench depth/trench width) of 3 or more. This reduces the area of the bottom portion of each trench structure that faces the collector side, which reduces the capacitance that occurs between the collector electrode layer and the gate electrode layer. This provides improved switching speed. With this arrangement, the dummy gates and the trench gates are formed in the same steps. Accordingly, by designing the dummy gates and the trench gates in the same shape, this arrangement allows the process and the masks to be designed in a simple manner, and also provides improved yield.

Description has been made in the aforementioned examples of the present invention using technical terms such as emitter, source, and gate. However, different technical terms are used for RC-IGBTs or the like (MOSFET built-in IGBT or diode built-in IGBT), etc. The present invention is applicable to RC-IGBTs. In such a case, the corresponding electrodes may be referred to using different technical terms.

REFERENCE SIGNS LIST 1 insulated gate bipolar transistor device, 3 collector electrode layer, 5 emitter electrode layer, 7 N-base layer, 9 N-buffer layer, 11 P-emitter layer, 12 insulating film, 13 P-base layer, 15 N-source layer, 17 trench structure, 18 trench gate, 19 oxide film, 21 polysilicon portion, 23 plug electrode, 25 plug electrode, 27 wiring portion, 29 polysilicon portion, 31 plug electrode, 33 wiring portion, 35 dummy gate, 37 polysilicon portion, 39 plug electrode, 41 wiring portion, 43 via hole, 45 plug electrode, 57 side wall 71 interlayer insulating film, 73 gap for forming plug electrode, 75 gap for forming wiring portion, 77 surface, 79 interlayer insulating film, 81 plug electrode, 83 gap for forming via hole, 85 layer in which via holes are formed, 86 layer including wiring portion, 88 layer in which plug electrodes are formed.

The invention claimed is:

1. An insulated gate bipolar transistor device comprising a first main electrode layer, a second main electrode, and a control electrode, the insulated gate bipolar device comprising:
   a first conductive first semiconductor layer;
   a first conductive second semiconductor layer formed in a first main electrode layer side of the first conductive first semiconductor layer;
   a second conductive first semiconductor layer formed between the first conductive second semiconductor layer and the first main electrode layer;
   a second conductive second semiconductor layer formed in a second main electrode side of the first conductive first semiconductor layer;
   a first conductive third semiconductor layer selectively formed in a second main electrode side of the second conductive second semiconductor layer; and
   a plurality of groove structures each protruding from a surface on a second main electrode side of the second conductive second semiconductor layer or otherwise the first conductive third semiconductor layer up to the first conductive first semiconductor layer,
   wherein each of the groove structures comprises:
      a conductive material region configured of a semiconductor material; and
      an insulating film formed on a surface of the conductive material region except for a surface on a second main electrode side,
   wherein the plurality of groove structures comprise at least:
      a main control groove structure;
      a first pseudo groove structure; and
      a second pseudo groove structure,
   wherein there is any one from among other groove structures between the first pseudo groove structure and the second pseudo groove structure, wherein a main control conductive material region configured as the conductive material region included in the main control groove structure is connected to the control electrode, wherein a first electrode formed on a surface of the first conductive third semiconductor layer adjacent to the main control groove structure and a second electrode formed on a surface of the second conductive second semiconductor layer adjacent to the main control groove structure are connected to the second main electrode, wherein a first pseudo conductive material region configured as the conductive material region included in the first pseudo groove structure is connected to the second main electrode without being connected to the control electrode, wherein a second pseudo conductive material region configured as the conductive material region included in the second pseudo groove structure is connected to the second main electrode without being connected to the control electrode, and wherein the first conductive third semiconductor layer is also formed between the first pseudo groove structure and the second pseudo groove structure.

2. The insulated gate bipolar transistor device comprising a plurality of pseudo groove structure pairs of the first pseudo groove structure and the second pseudo groove structure according to claim 1, with the second conductive second semiconductor layer according to claim 1 formed between the first pseudo groove structure and the second pseudo groove structure, and with the first conductive third semiconductor layer according to claim 1 not formed between the first pseudo groove structure and the second pseudo groove structure.

3. The insulated gate bipolar transistor device according to claim 2, further comprising a plurality of the first pseudo groove structures and a plurality of the second pseudo groove structures, and wherein at least a part of the second conductive second semiconductor layer portions each formed between the first pseudo groove structure and the second pseudo groove structure is not directly connected to the second main electrode.

4. The insulated gate bipolar transistor device according to claim 2, further comprising a plurality of the first pseudo groove structures and a plurality of the second pseudo groove structures, and wherein at least a part of the second conductive second semiconductor layer portions each formed between the first pseudo groove structure and the second pseudo groove structure is directly connected to the second main electrode.

5. The insulated gate bipolar transistor device according to claim 4, comprising the first pseudo groove structure or otherwise the second pseudo groove structure interposed between the second conductive second semiconductor layer portions each directly connected to the second main electrode, wherein the first pseudo conductive material region of the first pseudo groove structure or otherwise the second pseudo conductive material region of the second pseudo groove structure is directly connected to the control electrode.

6. The insulated gate bipolar transistor device according to claim 5, wherein at least one from among the second conductive second semiconductor layer portions arranged on both sides of the first pseudo groove structures or otherwise the second pseudo groove structures has a region that is in contact with the first pseudo groove structure or otherwise the second pseudo groove structure with a depth that is 90% or more of a depth of the first pseudo groove structure or otherwise the second pseudo groove structure.

7. The insulated gate bipolar transistor device according to claim 2, further comprising two or more layers between the first conductive third semiconductor layer and the second main electrode, wherein the two or more layers comprise:
a plug electrode layer configured such that it is in contact with the first conductive third semiconductor layer and to have the first electrode and the second electrode; and
an insulating layer configured to selectively insulate electrical connection to the second main electrode, wherein the trench gate and the first dummy trench are configured as adjacent trench structures, and wherein the plug electrode layer that corresponds to a portion interposed between the trench gate and the first dummy trench has the same structure as that of the plug electrode layer that corresponds to a portion interposed between the first dummy trench and the second dummy trench.

8. The insulated gate bipolar transistor device according to claim 1, further comprising a third electrode and a fourth electrode connected to the second main electrode, wherein the third electrode and the fourth electrode are each configured such that they pass through a first conductive third semiconductor layer adjacent to the main control groove structure, such that they reach an interior of a second conductive second semiconductor layer, and such that they are not in contact with the first conductive high resistance layer.

9. The insulated gate bipolar transistor device according to claim 8, wherein the first conductive third semiconductor layer and the second conductive second semiconductor layer are configured on a surface on a second main electrode side interposed between the plurality of groove structures such that they are alternately exposed in a longitudinal direction of the groove structures.

10. The insulated gate bipolar transistor device according to claim 1, wherein an area of a portion thereof on which the groove structures are not formed is smaller than 30% or less of an effective element area, and wherein the groove structure is configured with a groove depth that is three times or more a groove width thereof.

11. The insulated gate bipolar transistor device according to claim 1, wherein a portion interposed between the two adjacent groove structures is configured with a size of 0.5 μm or less.

12. An insulated gate bipolar transistor device comprising a collector electrode layer, an emitter electrode layer, and a gate electrode layer, the insulated gate bipolar device comprising:
a first conductive high-resistance layer;
a first conductive buffer layer formed in a collector electrode layer side of the first conductive high-resistance layer;
a second conductive emitter layer formed between the first conductive buffer layer and the collector electrode layer;
a second conductive base layer formed in an emitter electrode layer side of the first conductive high-resistance layer;

a first conductive source layer selectively formed in an emitter electrode layer side of the second conductive base layer; and a plurality of trench structures each protruding from a surface on an emitter electrode layer side of the second conductive base layer or otherwise the first conductive source layer up to the first conductive high-resistance layer, wherein each of the trench structures comprises:
- a trench portion configured of a semiconductor material; and
- an insulating film formed on a surface of the trench portion except for a surface on a side of the emitter electrode layer, wherein the plurality of trench structures comprise at least:
- a trench gate;
- a first dummy gate; and
- a second dummy gate, wherein there is any one from among other trench structures between the first dummy trench and the second dummy trench, wherein a gate trench portion configured as the trench portion included in the trench gate is connected to the gate electrode layer, wherein a first plug electrode formed on a surface of the first conductive source layer adjacent to the trench gate and a second plug electrode formed on a surface of the second conductive base layer adjacent to the trench gate are connected to the emitter electrode layer, wherein a first dummy trench portion configured as the trench portion included in the first dummy trench is connected to the emitter electrode layer without being connected to the gate electrode layer, wherein a second dummy trench portion configured as the trench portion included in the second dummy trench is connected to the emitter electrode layer without being connected to the gate electrode layer, and wherein the first conductive source layer is also formed between the first dummy trench and the second dummy trench.

13. The insulated gate bipolar transistor device according to claim 12, wherein the first conductive source layer and the second conductive base layer are structured on a surface on an emitter electrode layer side such that they are alternately arranged along a longitudinal direction of the trench gate, and wherein the first conductive source layer and the second conductive base layer are also structured on a surface interposed between the first dummy trench and the second dummy trench on an emitter electrode layer side such that they are alternately arranged along a longitudinal direction of the first dummy trench and the second dummy trench.

14. The insulated gate bipolar transistor device according to claim 12, wherein a third plug electrode that differs from the first plug electrode and the second plug electrode is formed between the first dummy trench and the second dummy trench such that it is in contact with at least one from among the first conductive source layer and the second conductive base layer.

15. The insulated gate bipolar transistor device according to claim 14, wherein the third plug electrode is arranged such that it is in contact with the first conductive source layer formed between the first dummy trench and the second dummy trench, and wherein the third plug electrode and the emitter electrode layer are electrically insulated from each other.

16. The insulated gate bipolar transistor device according to claim 14, wherein a fourth plug electrode that differs from the first plug electrode and the second plug electrode is arranged such that it is in contact with the second conductive base layer formed between the first dummy trench and the second dummy trench, and wherein the fourth plug electrode and the emitter electrode layer are electrically insulated from each other.

17. The insulated gate bipolar transistor device according to claim 14, wherein the third plug electrode is arranged such that it is in contact with the first conductive source layer formed between the first dummy trench and the second dummy trench, wherein a fourth plug electrode that differs from the first plug electrode, the second plug electrode, and the third plug electrode is arranged such that it is in contact with the second conductive base layer formed between the first dummy trench and the second dummy trench, and wherein the third plug electrode and the fourth plug electrode are electrically insulated from each other.

18. The insulated gate bipolar transistor device according to claim 12, wherein the insulated gate bipolar transistor device comprises at least two layers between the first conductive source layer and the emitter electrode layer, wherein the at least two layers comprise:
- a plug electrode layer arranged such that it is in contact with the first conductive source layer and comprising the first plug electrode and the second plug electrode; and
- an insulating layer configured to selectively insulate an electrical connection to the emitter electrode layer, wherein the trench gate and the first dummy trench are configured as adjacent trench structures, and wherein the plug electrode layer that corresponds to a portion interposed between the trench gate and the first dummy trench has the same structure as that of the plug electrode layer that corresponds to a portion interposed between the first dummy trench and the second dummy trench.

19. The insulated gate bipolar transistor device according to claim 18, wherein a trench width defined as a width of the trench structure configured on a surface on an emitter electrode layer side is larger than half of a center-to-center distance between the adjacent trench structures.

20. The insulated gate bipolar transistor device according to claim 12, wherein wiring connected to the first plug electrode, the second plug electrode, as well as or otherwise the emitter electrode layer is configured of a copper material.

21. The insulated gate bipolar transistor device according to claim 20, wherein the emitter electrode layer is connected to the first dummy trench portion as well as or otherwise the second dummy trench portion via copper wiring, and wherein a wiring structure is formed such that it extends in a direction that is orthogonal to a surface of the first conductive source layer on the emitter electrode layer side.

22. An insulated gate bipolar transistor device comprising a first main electrode, a second main electrode, and a control electrode, wherein the first conductive first semiconductor layer is arranged between the first main electrode and the second main electrode, wherein the first conductive first semiconductor layer comprises a first groove structure, a second groove structure, and a third groove structure, each of which is configured as a groove structure that protrudes from a surface on the second main electrode side toward the first main electrode side, wherein there is no groove structure between the first groove structure and the second groove structure, wherein the first groove structure and the second groove structure are each electrically connected to the second main electrode, wherein the third groove structure is electrically connected to the control electrode, and wherein a region of the first conductive first semiconductor layer interposed between the first groove structure and the second groove structure further comprises: a second conductive first semiconductor layer in which an inversion layer is to be formed by means of the control electrode; and a first conductive second semiconductor layer configured to inject carriers into the inversion layer formed in the second conductive first semiconductor layer.

23. The insulated gate bipolar transistor device comprising a plurality of groove structure pairs of the first groove structure and the second groove structure according to claim 22, with the second conductive first semiconductor layer according to claim 22 formed between the first groove structure and the second groove structure, and with the first conductive second semiconductor layer according to claim 22 not formed between the first groove structure and the second groove structure.

24. The insulated gate bipolar transistor device according to claim 22, wherein an area of a portion thereof on which the groove structures are not formed is smaller than 30% or less of an effective element area, and wherein the groove structure is configured with a groove depth that is three times or more a groove width thereof.

25. The insulated gate bipolar transistor device according to claim 22, wherein a portion interposed between the two adjacent groove structures is configured with a size of 0.5 µm or less.

26. A manufacturing method for a semiconductor device comprising:
a second conductive base layer formation in which a second conductive base layer is formed in a first conductive high-resistance layer;
a first conductive source layer formation in which a first conductive source layer is formed as an internal portion of the second conductive base layer;
a trench formation in which a plurality of trench structures are formed such that they pass through the second conductive base layer and reach the first conductive high-resistance layer; and
a plug electrode layer formation in which a plug electrode layer comprising a plurality of plug electrodes is formed such that the plug electrodes are individually in contact with the plurality of trench structures, the plurality of first conductive source layer portions, and the plurality of second conductive base layer portions.

27. The manufacturing method for a semiconductor device according to claim 26, wherein, in the first conductive source layer formation, the first conductive source layer is formed for all the plurality of second conductive base layer portions.

28. The manufacturing method for a semiconductor device according to claim 26, further comprising polishing in which the plug electrode layer is polished.

29. A manufacturing method for an insulated gate bipolar transistor device comprising an emitter wiring structure formation in which a wiring structure is formed for the semiconductor device manufactured using the manufacturing method according to claim 26, such that a part of the plurality of plug electrodes are connected to the emitter electrode layer.

* * * * *